(12) United States Patent
Mieher

(10) Patent No.: US 7,867,693 B1
(45) Date of Patent: Jan. 11, 2011

(54) METHODS FOR FORMING DEVICE STRUCTURES ON A WAFER

(75) Inventor: Walter D. Mieher, Los Gatos, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 692 days.

(21) Appl. No.: 11/681,008

(22) Filed: Mar. 1, 2007

Related U.S. Application Data

(60) Provisional application No. 60/779,131, filed on Mar. 3, 2006.

(51) Int. Cl.
*G03F 7/20* (2006.01)
*G03F 7/00* (2006.01)
*G03F 7/26* (2006.01)
*G03F 7/40* (2006.01)

(52) U.S. Cl. .......................... 430/317; 430/5; 430/311; 430/312; 430/322; 430/331; 430/394; 430/396; 430/270.1

(58) Field of Classification Search ............ 430/5, 430/311, 312, 317, 322, 331, 270.1, 394, 430/396
See application file for complete search history.

(56) References Cited

U.S. PATENT DOCUMENTS

| | | | |
|---|---|---|---|
| 6,208,747 B1 * | 3/2001 | Nguyen et al. | 382/100 |
| 6,403,291 B1 * | 6/2002 | Kawashima et al. | 430/394 |
| 6,444,398 B1 * | 9/2002 | Cummings | 430/296 |
| 6,511,791 B1 * | 1/2003 | Bukofsky et al. | 430/311 |
| 6,534,244 B1 * | 3/2003 | Zimlich et al. | 430/313 |
| 6,794,118 B2 * | 9/2004 | Okamoto et al. | 430/311 |
| 6,968,253 B2 * | 11/2005 | Mack et al. | 700/121 |
| 7,037,626 B2 * | 5/2006 | Dirksen et al. | 430/5 |
| 7,351,666 B2 * | 4/2008 | Furukawa et al. | 438/736 |
| 7,425,391 B2 * | 9/2008 | Zhang | 430/5 |
| 7,579,137 B2 * | 8/2009 | Colburn et al. | 430/313 |
| 2001/0006414 A1 * | 7/2001 | Gelbart | 355/53 |
| 2003/0143468 A1 * | 7/2003 | Cauchi | 430/5 |
| 2003/0143470 A1 * | 7/2003 | Nolscher et al. | 430/5 |
| 2004/0146808 A1 * | 7/2004 | Dirksen et al. | 430/311 |
| 2006/0204073 A1 * | 9/2006 | Ghinovker et al. | 382/144 |

* cited by examiner

*Primary Examiner*—Amanda C. Walker
(74) *Attorney, Agent, or Firm*—Ann Marie Mewherter

(57) ABSTRACT

Methods for forming device structures on a wafer are provided. One method includes transferring approximately an inverse of patterned features formed in a positive resist layer on the wafer to a device material on the wafer to form the device structures in the device material. Another method includes transferring approximately an inverse of patterned features formed in a sacrificial layer on the wafer to a device material on the wafer to form the device structures in the device material.

46 Claims, 8 Drawing Sheets

METHODS FOR FORMING DEVICE STRUCTURES ON A WAFER

PRIORITY CLAIM

This application claims priority to U.S. Provisional Application No. 60/779,131 entitled "Methods for Forming Device Structures on a Wafer," filed Mar. 3, 2006, which is incorporated by reference as if fully set forth herein.

BACKGROUND OF THE INVENTION

1. Field of the Invention

The present invention generally relates to methods for forming device structures on a wafer. Certain embodiments relate to a method that includes transferring approximately an inverse of patterned features formed in a positive resist layer on the wafer to a device material on the wafer to form device structures in the device material.

2. Description of the Related Art

The following description and examples are not admitted to be prior art by virtue of their inclusion in this section.

Semiconductor fabrication processes typically involve a number of lithography steps to form various features and multiple levels of a semiconductor device. Lithography involves transferring a pattern to a resist formed on a semiconductor substrate, which may be commonly referred to as a wafer. A reticle, or a mask, is disposed above the resist and may have substantially transparent regions and substantially opaque regions configured in a pattern that is transferred to the resist. As such, substantially opaque regions of the reticle may protect underlying regions of the resist from exposure to an energy source. The resist may, therefore, be patterned by selectively exposing regions of the resist to an energy source such as ultraviolet light, a beam of electrons, or an x-ray source. The patterned resist may then be used to mask underlying layers in subsequent semiconductor fabrication processes such as ion implantation and etch. Therefore, a resist may substantially inhibit an underlying layer such as a dielectric material or the semiconductor substrate from implantation of ions or removal by etch.

Lithography may be performed using two sequential interleaved lithography exposures. There are a number of methods that are currently used to perform such lithography exposures. One method uses negative photoresist to perform the lithography. This method has a number of disadvantages. For example, positive resists are much more developed and much more commonly used. In addition, it is believed that few negative photoresists for 193 nm exposure exist to meet the requirements for the 32 nm International Technology Roadmap for Semiconductors (ITRS) node.

Another method includes etching between the interleaved photolithography patterning steps. However, this method is disadvantageous for a number of reasons. For example, this method doubles the cycle time and the number of process steps performed in the lithography and etch process cells. In particular, the sequence includes exposing and developing a first resist to create a first patterned resist, etching the first pattern in the material stack below the first resist, depositing, exposing and developing a second resist to create a second patterned resist, and etching the second pattern in the material stack below the second resist. This method is also disadvantageous since overlay error between the first patterned resist and the second patterned resist affects the width of the final etched features.

An additional method includes exposing and developing a first resist to create a first patterned resist, then coating over the first patterned resist with a second resist. The method includes alignment of the second reticle to a pattern formed in the first resist, or to another pattern formed on the wafer, or both. The method includes exposing and developing the second resist to create the second patterned resist, then etching both the first patterned resist pattern and the second patterned resist pattern into the material stack to be etched simultaneously. Such methods are disadvantageous since the second patterned resist will have significant non-uniformity due to the topography of the first patterned resist. This non-uniformity may cause larger variations in the width of the features of the second patterned resist after the features are developed in the second resist and therefore after etch.

Accordingly, it may be advantageous to develop methods for forming device structures in which lithography is performed using two sequential interleaved lithography exposures that eliminate one or more of the disadvantages of the methods described above.

SUMMARY OF THE INVENTION

The following description of various embodiments of methods is not to be construed in any way as limiting the subject matter of the appended claims.

One embodiment relates to a method for forming device structures on a wafer. The method includes transferring approximately an inverse of patterned features formed in a positive resist layer on the wafer to a device material on the wafer to form the device structures in the device material.

In one embodiment, the method includes forming the patterned features in the positive resist layer using two different reticles for two interleaved exposures of the positive resist layer. In one such embodiment, each of the two different reticles includes only a portion of the patterned features. In another embodiment, the method includes forming the patterned features in the positive resist layer by exposing two different patterns on one reticle sequentially in two interleaved exposures of the positive resist layer. In this manner, the method may include forming the patterned features in the positive resist layer using two different patterns used sequentially on the same reticle.

In another embodiment, the method includes forming the patterned features in the positive resist layer using two interleaved exposures of the positive resist layer without performing a develop process on the wafer between the two interleaved exposures. In an additional embodiment, the method includes forming the patterned features in the positive resist layer using two interleaved exposures of the positive resist layer without performing an etch process on the wafer between the two interleaved exposures.

In one embodiment, the method includes forming the patterned features in the positive resist layer using two interleaved exposures of the positive resist layer. In one such embodiment, exposure doses used for the two interleaved exposures are different and selected based on differences in time between each of the two interleaved exposures and a develop process. The exposures are preferably optimized with the objective that the final device feature dimensions of both the first pattern and the second pattern are most likely to meet the device requirements. In another such embodiment, focus settings used for the two interleaved exposures are different and selected based on differences in time between each of the two interleaved exposures and a develop process. The focus settings are preferably optimized with the objective that the final device feature dimensions of both the first pattern and the second pattern are most likely to meet the device requirements.

As described above, in one embodiment, the method includes forming the patterned features in the positive resist layer using two different reticles for two interleaved exposures of the positive resist layer. In one such embodiment, one or more characteristics of features formed on the two different reticles are selected based on differences in time between each of the two interleaved exposures and a develop process.

In another such embodiment, the two different reticles include metrology targets configured for measurements of one or more characteristics of the patterned features resulting from a first of the two interleaved exposures, one or more characteristics of the patterned features resulting from a second of the two interleaved exposures, and one or more characteristics of the patterned features resulting from a combination of the two interleaved exposures.

In some embodiments, the method includes forming the patterned features in the positive resist layer using two interleaved exposures of the positive resist layer, and between the two interleaved exposures, the method includes developing the positive resist layer, etching a first sacrificial layer formed under the resist layer, and depositing a second sacrificial layer on the etched first sacrificial layer. The second sacrificial layer may be deposited on the etched first sacrificial layer to substantially fill spaces formed by etching the first sacrificial layer.

In another embodiment, the transferring step includes etching a first sacrificial layer to transfer approximately the patterned features formed in the positive resist layer to the first sacrificial layer, forming a second sacrificial layer on the etched first sacrificial layer, removing the etched first sacrificial layer such that remaining portions of the second sacrificial layer form patterned features that are approximately the inverse of the patterned features formed in the first sacrificial layer, and etching the device material to transfer approximately the patterned features of the second sacrificial layer to the device material to form the device structures in the device material.

As described above, in some embodiments, the method includes forming the patterned features in the positive resist layer using two interleaved exposures of the positive resist layer. In one such embodiment, overlay error between the two interleaved exposures does not affect dimensions of the device structures in the device material. In another embodiment, the method includes forming the patterned features in the positive resist layer using two interleaved photolithography exposures of the positive resist layer. In one such embodiment, the device structures have a dimension in a direction substantially parallel to an upper surface of the wafer that is less than about 40 nm.

In another embodiment, the method includes forming the patterned features in the positive resist layer. In one such embodiment, the transferring step includes depositing a sacrificial layer on the patterned features in the positive resist layer, removing the sacrificial layer formed above the patterned features in the positive resist layer, removing the positive resist layer such that remaining portions of the sacrificial layer form patterned features that are approximately the inverse of the patterned features formed in the positive resist layer, and transferring approximately the patterned features formed in the sacrificial material to the device material. In some embodiments, the device structures include transistor gate structures.

Each of the steps of the method embodiments described above may be performed as described further herein. In addition, each of the embodiments of the method described above may include any other step(s) of any other method(s) described herein.

Another embodiment relates to a different method for forming device structures on a wafer. This embodiment includes transferring approximately an inverse of patterned features formed in a sacrificial layer on the wafer to a device material on the wafer to form the device structures in the device material.

In one embodiment, the method includes forming the device material on the wafer before the sacrificial layer is formed on the wafer. In another embodiment, the method includes forming an additional sacrificial layer on the wafer after the patterned features are formed in the sacrificial layer. In one such embodiment, the transferring step includes transferring approximately the inverse of the patterned features formed in the sacrificial layer to the additional sacrificial material and transferring approximately the patterned features formed in the additional sacrificial material to the device material.

In an additional embodiment, the transferring step includes forming an additional sacrificial layer between the patterned features formed in the sacrificial layer, removing the sacrificial layer such that remaining portions of the additional sacrificial layer form patterned features that are approximately the inverse of the patterned features formed in the sacrificial layer, and etching the device material to transfer approximately the patterned features of the additional sacrificial layer to the device material to form the device structures in the device material.

In another embodiment, the method includes forming the patterned features in the sacrificial layer by forming approximately the patterned features in a positive resist layer formed on the sacrificial layer using two interleaved exposures (e.g., photolithography exposures) of the positive resist layer and etching the sacrificial layer to transfer approximately the patterned features formed in the positive resist layer to the sacrificial layer. In one such embodiment, the device structures have a dimension in a direction substantially parallel to an upper surface of the wafer that is less than about 40 nm. In some embodiments, the device structures include transistor gate structures.

Each of the steps of the method embodiments described above may be performed as described further herein. In addition, each of the embodiments of the method described above may include any other step(s) of any other method(s) described herein.

An additional embodiment relates to another method for forming device structures on a wafer. This method includes transferring patterned features formed in a positive resist layer on the wafer to a first sacrificial material formed under the positive resist layer to form approximately the patterned features in the first sacrificial material. The method also includes transferring approximately an inverse of the patterned features in the first sacrificial material to a second sacrificial material deposited on the first sacrificial material to form approximately the inverse of the patterned features in the second sacrificial material. In addition, the method includes transferring approximately the patterned features of the second sacrificial material to a device material formed under the second sacrificial material to form the device structures in the device material.

Each of the steps of the method embodiment described above may be performed as described further herein. In addition, the embodiment of the method described above may include any other step(s) of any other method(s) described herein.

A further embodiment relates to a method for forming device structures on a wafer. The method includes transferring approximately an inverse of patterned features formed in a positive resist layer on the wafer to a device material on the wafer to form the device structures in the device material. The transferring step includes exposing the positive resist layer using two different reticles for two interleaved exposures of the positive resist layer without performing a develop process on the wafer between the two interleaved exposures. Each of the two different reticles include only a portion of the patterned features. The transferring step also includes developing the exposed positive resist layer to form a resist pattern. In addition, the transferring step includes etching a first sacrificial layer to transfer the resist pattern into the first sacrificial layer with a first etch process thereby forming a pattern in the first sacrificial layer.

The transferring step further includes cleaning remaining resist and etch residues from the etch process from the wafer and the etched first sacrificial layer in a first cleaning process. In addition, the transferring step includes depositing a second sacrificial layer after the cleaning step. The transferring step also includes removing excess material of the second sacrificial layer to leave some of the second sacrificial layer in spaces of the pattern in the first sacrificial layer to form a pattern in the second sacrificial layer.

The transferring step further includes selectively removing the first sacrificial layer. In addition, the transferring step includes approximately transferring the pattern in the second sacrificial layer into the device material using process steps including a second etch process and a second cleaning process.

In one embodiment, the device structures include transistor gate structures. In another embodiment, the device structures include memory word-line structures. In an additional embodiment, the device structures include memory bit-line structures.

In some embodiments, the removing step includes chemical mechanical planarization (CMP). In another embodiment, the removing step includes an etch back process using reactive ion etching (RIE). In an additional embodiment, the removing step includes an etch back process using wet etching. In a further embodiment, the transferring step includes, between the selectively removing step and the approximately transferring step, trim etching the pattern in the second sacrificial layer.

Each of the steps of the method embodiments described above may be performed as described further herein. In addition, the embodiments of the method described above may include any other step(s) of any other method(s) described herein.

Yet another embodiment relates to a method for forming device structures on a wafer. The method includes transferring approximately an inverse of patterned features formed in a positive resist layer on the wafer to a device material on the wafer to form the device structures in the device material. The transferring step includes exposing a first positive resist layer to only a first portion of the patterned features using a first reticle.

The transferring step also includes developing the first positive resist layer to form the first portion of the patterned features in the first positive resist layer. In addition, the transferring step includes depositing a second positive resist layer.

The transferring step further includes exposing the second positive resist layer to only a second portion of the patterned features using a second reticle. Exposing the first positive resist layer and exposing the second positive resist layer includes exposing two interleaved patterns. The transferring step also includes developing the second positive resist layer to form the second portion of the patterned features in the second positive resist layer. In addition, the transferring step includes transferring the first and second portions of the patterned features into a first sacrificial layer with a first etch process to form a pattern in the first sacrificial layer.

The transferring step further includes cleaning remaining first and second positive resist layers and etch residue from the first etch process from the wafer and the pattern in the first sacrificial layer. The transferring step also includes depositing a second sacrificial layer after the cleaning step. In addition, the transferring step includes removing excess material of the second sacrificial layer to leave some of the second sacrificial layer in spaces of the pattern in the first sacrificial layer to form a pattern in the second sacrificial layer.

The transferring step further includes selectively removing the first sacrificial layer. In addition, the transferring step includes approximately transferring the pattern in the second sacrificial layer into the device material using process steps including a second etch process and a second cleaning process.

In one embodiment, the device structures include transistor gate structures. In another embodiment, the device structures include memory word-line structures. In an additional embodiment, the device structures include memory bit-line structures.

In one embodiment, the removing step includes CMP. In another embodiment, the removing step includes an etch back process using RIE. In an additional embodiment, the removing step includes an etch back process using wet etching. In some embodiments, the transferring step includes, between the selectively removing step and the approximately transferring step, trim etching the pattern in the second sacrificial layer.

Each of the steps of the method embodiments described above may be performed as described further herein. In addition, the embodiments of the method described above may include any other step(s) of any other method(s) described herein.

Still another embodiment relates to a method for forming device structures on a wafer. The method includes transferring approximately an inverse of patterned features formed in a positive resist layer on the wafer to a device material on the wafer to form the device structures in the device material. The transferring step includes exposing a first pattern in a first positive resist layer using a first of two different reticles designed to form two interleaved patterns. Each of the two different reticles includes only a portion of the pattern features. The transferring step also includes developing the exposed first positive resist layer to form a first resist pattern. In addition, the transferring step includes transferring the first resist pattern into a first sacrificial layer with a first etch process to form a first pattern in the first sacrificial layer.

The transferring step further includes depositing a second positive resist layer. In addition, the transferring step includes aligning a second of the two different reticles to the first pattern in the first sacrificial layer, to another pattern formed on the wafer, or another material on the wafer. The transferring step also includes exposing a second pattern in the second positive resist layer using the second of the two different reticles and developing the exposed second positive resist layer to form a second resist pattern.

The transferring step further includes transferring the second resist pattern into the first sacrificial layer with a second etch process to form a second pattern in the first sacrificial layer. The transferring step also includes cleaning remaining resist and etch residues from the wafer and the first and second patterns in the first sacrificial layer. In addition, the transferring step includes depositing a second sacrificial layer after the cleaning step.

The transferring step further includes removing excess material of the second sacrificial layer to leave some of the second sacrificial layer in spaces of the first and second patterns in the first sacrificial layer to form a pattern in the second sacrificial layer. In addition, the transferring step includes selectively removing the first sacrificial layer. The transferring step also includes approximately transferring the pattern in the second sacrificial layer into the device material using process steps including a third etch process and a second cleaning process.

In one embodiment, the device structures include transistor gate structures. In another embodiment, the device structures include memory word-line structures. In an additional embodiment, the device structures include memory bit-line structures.

In one embodiment, the removing step includes CMP. In another embodiment, the removing step includes an etch back process using RIE. In an additional embodiment, the removing step includes an etch back process using wet etching. In some embodiments, the transferring step includes, between the selectively removing step and the approximately transferring step, trim etching the pattern in the second sacrificial layer.

Each of the steps of the method embodiments described above may be performed as described further herein. In addition, the embodiments of the method described above may include any other step(s) of any other method(s) described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
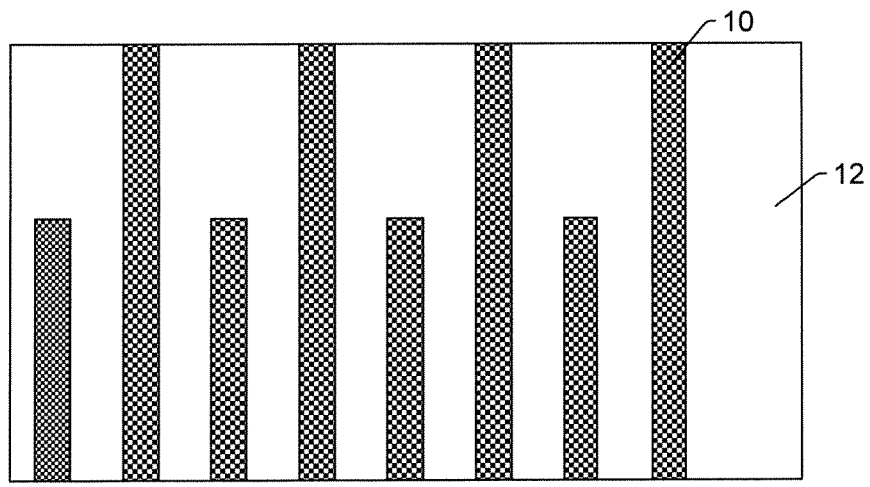
FIG. 1 is a schematic diagram illustrating a top view of one example of device structures to be formed on a wafer.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "reticle" and "mask" are used interchangeably herein. A reticle generally includes a transparent substrate such as glass, borosilicate glass, and fused silica having opaque regions formed thereon in a pattern. The opaque regions may be replaced by regions etched into the transparent substrate. Many different types of reticles are known in the art, and the term reticle as used herein is intended to encompass all types of reticles. Phase shift reticles, including attenuated phase shift reticles, alternating phase shift reticles, and chromeless phase shift reticles can be designed, constructed, and employed to produce approximately the desired patterned features in a positive resist layer as described herein, which are approximately the inverse of the device structures to be formed on a wafer. For simplicity, the embodiments are described herein with respect to patterned features produced with reticles with substantially opaque and transparent regions, but this is not a limitation of the embodiments. For example, the use of phase shift reticles is within the scope of the embodiments described herein.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities. A wafer may include one or more layers formed upon a substrate. For example, such layers may include, but are not limited to, a resist, a dielectric material, a conductive material, and a semiconductor layer (e.g., an epitaxial layer). Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

In general, the embodiments described herein relate to methods for forming device structures on a wafer. In addition, the embodiments described herein enable a method for patterning of device structures in which lithography is performed using two sequential interleaved lithography exposures. Specifically, the embodiments described herein enable the use of positive resist to perform lithography of interleaved patterns without the need to perform one or more etch patterning steps between the lithography steps. The embodiments described herein will be vastly more efficient and reduce or remove the impact of overlay error on the line width of the device structures.

The embodiments described herein generally include using a damascene type process to transfer approximately an inverse of patterned features formed in a positive resist layer and/or a sacrificial layer to a device material on the wafer to form device structures in the device material. In particular, one embodiment of a method for forming device structures on a wafer includes transferring approximately an inverse of patterned features formed in a positive resist layer on the wafer to a device material on the wafer to form the device structures in the device material. Another embodiment of a method for forming device structures on a wafer includes transferring approximately an inverse of patterned features formed in a sacrificial layer on the wafer to a device material on the wafer to form the device structures in the device material. In particular, the patterned features are designed such that approximately an inverse of the patterned features can be formed in a device material on a semiconductor substrate or wafer upon completion of a patterning process described herein.

It is well known in the art that the shapes of final device structures are not identical to the shapes of features in a reticle pattern because the shapes of features on a reticle are modified through various steps used to produce device structures on a wafer. Some of the process steps that transform the reticle pattern include: formation of the aerial image, formation of the latent image in the resist, developing the resist, etching, etc. It is to be understood that the design of the reticle, operation of the lithography system (e.g., stepper), and selection of materials and the processes should take these effects into account to obtain the desired device structures in the methods described herein. The terms "approximately the inverse of the patterned features" and the like are used herein to include these effects on the shape of the patterned features and device structures formed in the methods described herein and any process or design compensations, including reticle design compensations, employed to produce the functional device structures. In other words, the terms "approximately the inverse of the patterned features" and the like are used herein to refer to patterned features formed using a pattern transfer process and a reticle or a patterned sacrificial layer, which are not identical to or exactly the inverse of the reticle or the patterned sacrificial layer due to the pattern transfer process (e.g., the marginalities of the pattern transfer process).

In one embodiment, the method for forming device structures on a wafer includes transferring patterned features formed in a positive resist layer on the wafer to a first sacrificial layer formed under the positive resist layer to form approximately the patterned features in the first sacrificial layer, which may be performed as described further herein. The method also includes transferring approximately an inverse of the patterned features in the first sacrificial layer to a second sacrificial layer deposited on the first sacrificial layer to form approximately the inverse of the patterned features in the second sacrificial layer, which may be performed as described herein. The second sacrificial layer is formed on the wafer after transferring approximately the patterned features to the first sacrificial layer. In addition, the method includes transferring approximately the patterned features of the second sacrificial layer to a device material formed under the second sacrificial layer to form the device structures in the device material.

In some embodiments, therefore, the methods described herein use a damascene type process (which may include etch, inlay (e.g., deposition with chemical vapor deposition (CVD), plasma enhanced chemical vapor deposition (PECVD), a spin on material (like a resist or spin on dielectric), electro-plate deposition, sputter deposition, molecular beam epitaxy, atomic layer deposition, etc.), chemical-mechanical planarization (CMP) or etch back to remove excess inlaid material, and selective removal of the etched layer on which deposition was performed to thereby pattern (construct) a sacrificial layer (from the inlaid material) that can be used as a hard mask (etch masking structure) to reverse the tone of a double exposure lithography pattern formed in a positive tone resist.

The embodiments described herein advantageously reduce, and may even remove, the impact of overlay error on critical dimensions (CDs) of device structures formed in double-exposure fabrication processes. For example, in some embodiments, the exposure techniques described herein may be performed on the same positive resist layer without performing intermediate develop and etch steps between exposing a first pattern and exposing a second pattern. In particular, in one embodiment, as described further herein, the method includes forming patterned features in a positive resist layer using two interleaved exposures of the positive resist layer without performing a develop process on the wafer between the two interleaved exposures. In another embodiment, as described further herein, the method includes forming patterned features in a positive resist layer using two interleaved exposures of the positive resist layer without performing an etch process on the wafer between the two interleaved exposures. The embodiments described herein also advantageously do not require a negative tone resist.

Figure 2:
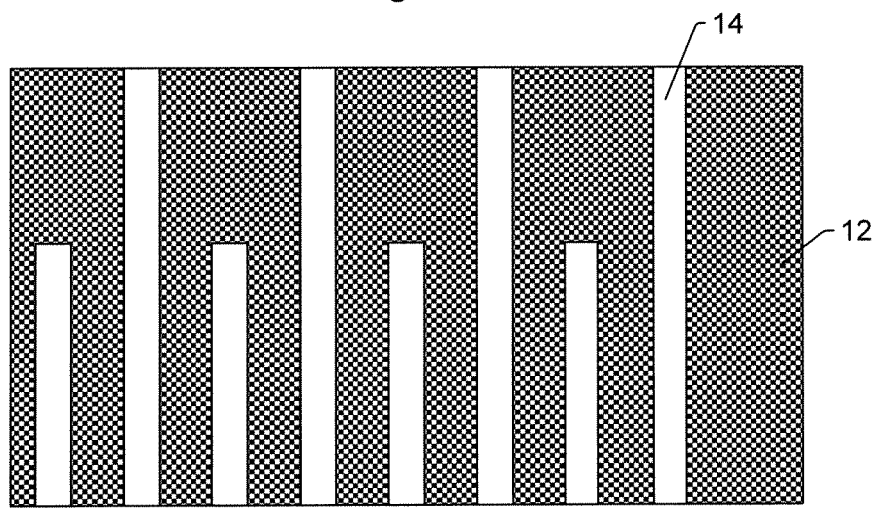
FIG. 2 is a schematic diagram illustrating a top view of an inverse of the device structures of FIG. 1.
Figure 3:
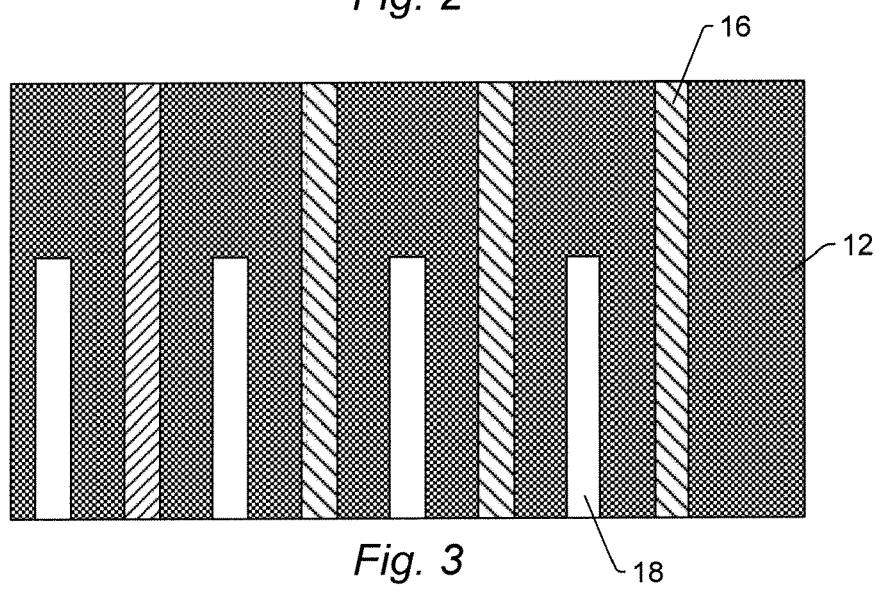
FIG. 3 is a schematic diagram illustrating a top view of the inverse of the device structures of FIG. 1 divided into two different patterns to be formed separately in a sacrificial layer on a wafer.

The differences between device structures and an inverse of the device structures are shown in FIGS. 1 and 2. In particular, FIG. 1 illustrates a top view of a portion of a desired final circuit pattern design to be formed on a wafer. In this example, device structures 10 indicate electrically conducting lines that are to be formed on wafer 12. FIG. 2 illustrates a top view of the inverse of the final circuit pattern design. As shown in FIG. 2, the inverse of device structures 10 is trenches 14 formed on wafer 12. In a dual-exposure based process, the inverse of the final circuit pattern design may be divided into two patterns that are exposed separately. For example, as shown in FIG. 3, the inverse of the final circuit pattern design may be divided into trenches 16 and trenches 18, which may be patterned on a positive resist layer in different exposure steps.

In the embodiments described herein, the reticle used for each exposure of the positive resist layer is a reverse tone of the features desired on the device. For example, if a line feature is selected to be formed on the wafer after completion of the multi-step patterning processes described herein, the reticle would have a linear space or other structures (e.g., structures including optical proximity correction (OPC) features and/or other resolution enhancement technique (RET) features) engineered to produce relatively bright light intensity (relatively high electromagnetic intensity) at that location (instead of a relatively dark region).

Figure 4:
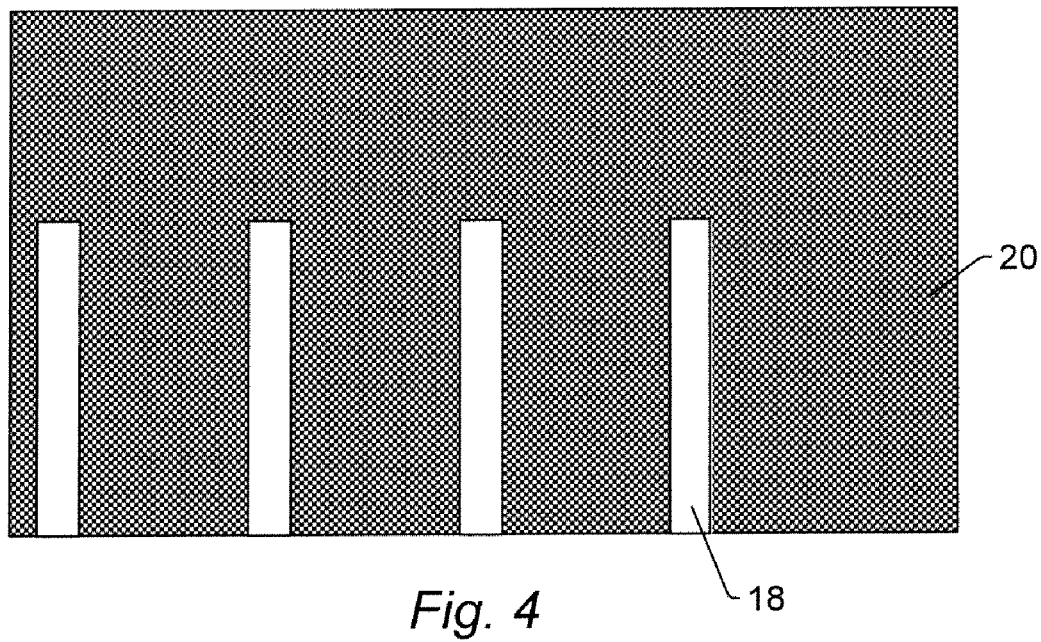
FIGS. 4-5 are schematic diagrams illustrating top views of different reticles that can be used to separately form the two different patterns of FIG. 3 in a positive resist layer on a wafer.

In some embodiments, the method includes forming the patterned features in the positive resist layer using two different reticles for two interleaved exposures of the positive resist layer. In one such embodiment, each of the two different reticles includes only a portion of the patterned features. For example, with respect to the examples described above, one reticle that may be used in the process to pattern one portion of approximately the inverse of the device structures is shown in FIG. 4. As shown in FIG. 4, this reticle includes trenches 18 shown in FIG. 3, but not trenches 16 shown in FIG. 3. Trenches 18 may be substantially transparent regions surrounded by substantially opaque region 20. The substantially transparent regions may include regions of the reticle substrate above which a substantially opaque material formed on the reticle substrate is removed by etching with the remaining substantially opaque material forming substantially opaque region 20. In this manner, the reticle shown in FIG. 4 may be used to pattern only a portion of approximately the inverse of the device structures in the positive resist layer.

Figure 5:
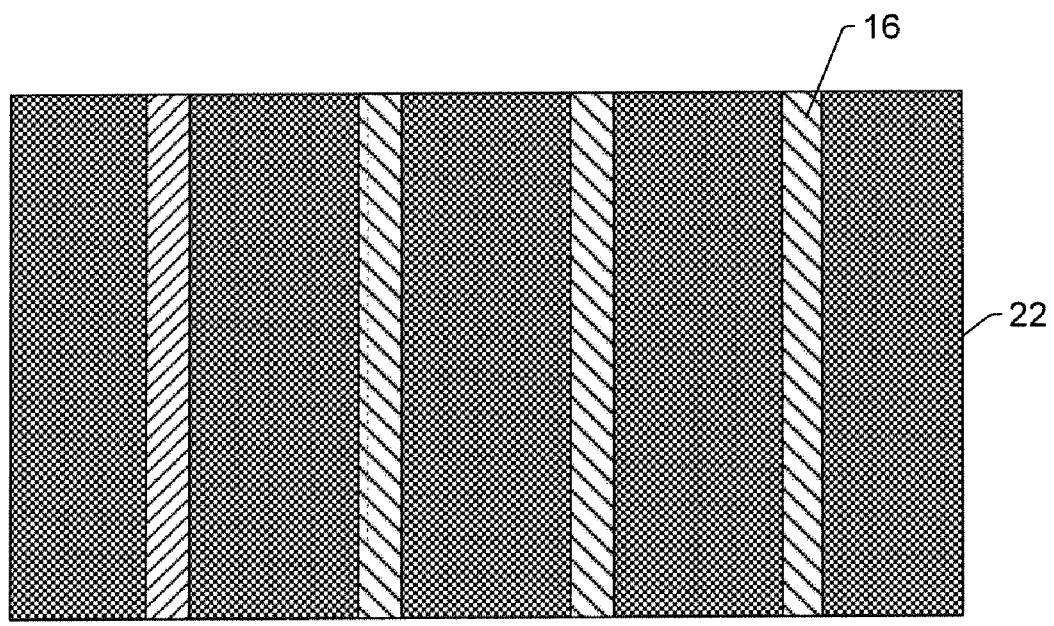

The features on the second reticle are also primarily the reverse tone of the device structures to be patterned with the second reticle. For example, with respect to the examples described above, a reticle that may be used in the methods described herein to pattern a second portion of the approximate inverse of the device structures is shown in FIG. 5. As shown in FIG. 5, this reticle includes trenches 16 shown in FIG. 3, but not trenches 18 shown in FIG. 3. Trenches 16 may be substantially transparent regions of the reticle surrounded by substantially opaque region 22. The substantially transparent regions and the substantially opaque region may be formed as described above. As such, the reticle shown in FIG. 5 may be used to pattern only a portion of the approximate inverse of the device structures in the positive resist layer. When the positive tone resist layer is exposed to radiation from the projected image of the first reticle or from the projected image of the second reticle, the exposed portions of the positive resist layer will be removed when it is developed thereby forming the approximate inverse of the device structures in the positive resist layer.

As described above, therefore, the interleaved exposures may be performed with two different reticles. However, in another embodiment, the patterned features are formed in the positive resist layer by exposing two different patterns on one reticle sequentially in two interleaved exposures of the positive resist layer. In this manner, the patterned features may be formed in the positive resist layer using two different patterns used sequentially on the same reticle.

The method may include the following steps. In addition, it is to be understood that measurement and inspection steps appropriate or beneficial to each of these process steps may be included in the embodiments described herein, but will not be detailed herein for the sake of brevity. The measurement and inspection steps may include any appropriate measurement and inspection steps known in the art.

One embodiment of a method for forming device structures on a wafer includes forming patterned features in a masking material such as a positive resist layer and/or a sacrificial layer on the wafer. The patterned features are approximately an inverse of the device structures. The method may include depositing the materials to be patterned on the wafer (substrate). In one embodiment, the method includes forming the device material on the wafer before the sacrificial layer is formed on the wafer. In one such example, polysilicon may be deposited on the wafer for the transistor gate level, and one or more sacrificial layers (e.g., sacrificial layer(s) similar to those commonly referred to as "hard masks," which are generally used to improve the transfer of etching of resist patterns into device material layers) may also be deposited on the wafer. The device material and the sacrificial material may be formed on the wafer in any suitable manner using any suitable materials including the examples described herein. The method may also include depositing an anti-reflection coating and positive resist layer on the wafer. The anti-reflection coating and the positive resist layer may include any appropriate such materials and may be formed on the wafer in any suitable manner known in the art.

In one embodiment, the method includes forming patterned features, which are approximately an inverse of the device structures, in a sacrificial layer on the wafer by exposing one or more positive resist layers using two or more exposure processes and etching the one or more positive resist layers using one or more etch processes. In some embodiments, the method includes exposing a positive resist layer on the wafer two or more times to produce a patterned resist. For example, the method includes exposing a positive resist layer with a first pattern using a lithography system. The lithography system may be a photolithography system such as a stepper or scanner that uses radiation from a light source such as a laser at a wavelength of about 248 nm, about 193 nm, about 157 nm, or any other suitable wavelength known in the art. However, the lithography system may include any system that can be used to selectively illuminate specific areas of the resist with electromagnetic radiation such as light, x-rays, an electron beam, an ion beam, etc.

Figure 6:
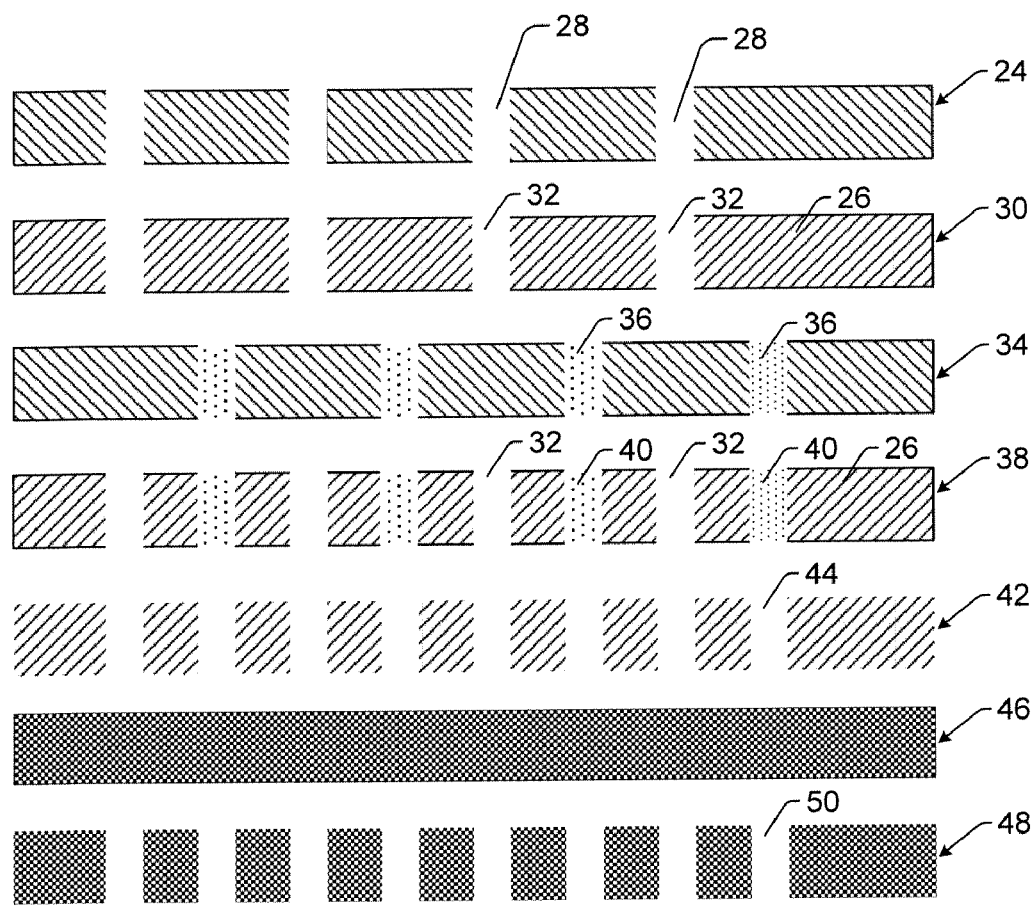
FIGS. 6-8 are schematic diagrams illustrating a cross-sectional view of a wafer after various steps of one embodiment of a method for forming device structures on the wafer.

Exposing a positive resist layer with a first pattern as described above using the reticle shown in FIG. 4 and a lithography system described above produces aerial image 24 shown in FIG. 6 that is projected onto a positive resist layer. Aerial image 24 includes aerial images 28 of trenches 18 of the reticle shown in FIG. 4. After exposure of the positive resist layer to the aerial image, latent image 30 is formed in positive resist layer 26, as shown in FIG. 6. Latent image 30 includes latent images 32 of trenches 18 of the reticle shown in FIG. 4. Latent image 30 shown in FIG. 6 may be formed in the positive resist layer after the exposure process and before the post exposure bake (PEB) process. Alternatively, latent image 30 may be formed in the positive resist layer only after the PEB process. The latent image may include recessed portions (not shown) of the positive resist layer that was exposed to aerial image 24.

The method also includes exposing a second pattern using a lithography system. The lithography system used to expose the second pattern may include any of those described above. In addition, the same lithography system, and therefore the same radiation source, may be used to expose the first and second patterns.

In one example, exposing the positive resist layer with a second pattern as described above using the reticle shown in FIG. 5 and a lithography system described above produces aerial image 34 shown in FIG. 6 projected onto the positive resist layer. Aerial image 34 includes aerial images 36 of trenches 16 of the reticle shown in FIG. 5. After exposure of the positive resist layer to aerial image 34, latent image 38 is formed in positive resist layer 26, as shown in FIG. 6. Latent image 38 includes latent images 32 of trenches 18 of the reticle shown in FIG. 4 that were formed in the first exposure step described above as well as latent images 40 of trenches 16 of the reticle shown in FIG. 5 that were formed in the second exposure step. Latent image 38 shown in FIG. 6 may be formed in the positive resist layer after the exposure process and before the PEB process. Alternatively, latent image 38 may be formed in the positive resist layer only after the PEB process. Latent image 38 may include recessed portions of the positive resist layer that were exposed to aerial image 24 and recessed portions (not shown) of the positive resist layer that were exposed to aerial image 34.

The method also includes developing the positive resist layer exposed to the composite pattern that includes the first pattern and the second pattern. For example, developing positive resist layer 26 shown in FIG. 6 after latent image 38 has been formed in the positive resist layer produces patterned positive resist layer 42 that includes trenches 44. Developing the exposed positive resist layer may be performed using a resist processing system, which is commonly referred to as a "track," that may include a lithography track that is commercially available from various companies such as Tokyo Electron Limited, Minato-ku, Tokyo, Japan or Dainippon Screen Mfg. Co., Ltd., (SOKUDO Co., Ltd., Shimogyo-ku, Kyoto Japan).

In one embodiment, the method includes forming the patterned features in the positive resist layer using two interleaved exposures of the positive resist layer, which may be performed as described further herein, and exposure doses used for the two interleaved exposures are different and selected based on differences in time between each of the two interleaved exposures and a develop process. For example, the method may include using different exposure doses for exposing the first pattern and exposing the second pattern to compensate for differences in times between exposures of the two patterns and the resist developing process. The resist developing process may include a PEB process and a develop process. In this manner, the method may include using a different exposure energy for the first exposure process to compensate for the timing delay between the first exposure step and the PEB process. The exposure doses are preferably optimized with the objective that the final device feature dimensions of both the first pattern and the second pattern are most likely to meet the device requirements.

In another embodiment, the method includes forming the patterned features in the positive resist layer using two interleaved exposures of the positive resist layer, which may be performed as described further herein, and focus settings used for the two interleaved exposures are different and selected based on differences in time between each of the two interleaved exposures and a develop process. The resist developing process may include a PEB process and a develop process. For example, the method may include pre-compensating for timing delay differences with different focus settings or a variety of focus conditions. The focus settings are preferably optimized with the objective that the final device feature dimensions of both the first pattern and the second pattern are most likely to meet the device requirements.

In a further embodiment, the method includes forming the patterned features in the positive resist layer using two different reticles for two interleaved exposures of the positive resist layer, which may be performed as described herein, and one or more characteristics of features formed on the two different reticles are selected based on differences in time between each of the two interleaved exposures and a develop process. The resist developing process may include a PEB process and a develop process. For example, the method may include pre-compensating for timing delay differences with different OPC features, CD bias, or other mask dimension adjustment for process (e.g. resist process).

In one embodiment, the method includes forming the patterned features in the positive resist layer using two different reticles for two interleaved exposures of the positive resist layer, which may be performed as described herein, and the two different reticles include metrology targets configured for measurements of one or more characteristics of the patterned features resulting from a first of the two interleaved exposures, one or more characteristics of the patterned features resulting from a second of the two interleaved exposures, and one or more characteristics of the patterned features resulting from a combination of the two interleaved exposures. For example, the method embodiments described herein may provide scatterometry CD (SCD) metrology targets and capability for each individual exposure and for the total structure (e.g., different feature widths or CDs from the first pattern and the second pattern and possible offsets or overlay errors or pattern placement errors (e.g., two different gaps)).

The method may optionally include trimming the patterned positive resist layer (e.g., using an etch process) if desired to achieve the desired feature widths, feature profiles, feature roughness, and/or to improve the robustness of pattern transfer in subsequent etch step(s). The trimming step may be performed in any suitable manner and may include any suitable process known in the art. The method may also optionally include thermal processing of the patterned positive resist layer to achieve the desired feature widths, feature profiles, feature roughness, and/or to improve the robustness of pattern transfer in subsequent etch step(s). The thermal processing may include any suitable thermal processing known in the art (e.g., a hard bake process that involves light and/or heat).

In one embodiment, transferring approximately the inverse of the patterned features formed in the positive resist layer to a device material on the wafer includes etching a first sacrificial layer to transfer approximately the patterned features formed in the positive resist layer to the first sacrificial layer. For example, in one embodiment, the method includes etching a sacrificial layer (also referred to herein as "a first sacrificial layer") exposed by the patterned positive resist layer to form a patterned sacrificial layer. In particular, the method includes etching the pattern of the developed positive resist layer into the first sacrificial layer (also referred to herein as the "first hard masking material"). As used herein, the term "sacrificial layer" is intended to encompass all possible materials including, but not limited to, silicon nitride, silicon oxides, amorphous carbon materials, carbide-silicon materials, etc. Etching the first sacrificial layer may include any suitable etch process known in the art, and the etch process that is used may be selected based on the sacrificial layer material that is used in the method.

In one example shown in FIG. 6, first sacrificial layer 46 may be formed under patterned positive resist layer 42. As shown in FIG. 6, after patterned positive resist layer 42 has been formed, the first sacrificial layer is not patterned. However, after the patterned positive resist layer has been formed, an etch process may be performed on the wafer. The etch process may be selected such that the areas of the first sacrificial layer that are exposed to the etch process by the patterned positive resist layer are removed. In one embodiment, therefore, the method includes forming the patterned features in the first sacrificial layer by forming approximately the patterned features in a positive resist layer formed on the first sacrificial layer using two interleaved exposures of the positive resist layer and etching the first sacrificial layer to transfer approximately the patterned features formed in the positive resist layer to the first sacrificial layer. In this manner, patterned first sacrificial layer 48 is formed by the etch process and includes trenches 50. As such, approximately the inverse of the device structures formed in the patterned positive resist layer are transferred to the first sacrificial layer.

In one embodiment, the method includes removing the patterned positive resist layer after etching of the first sacrificial layer. In addition, the method may include removing the positive resist layer and/or all anti-reflective coatings formed on the wafer after etching of the first sacrificial layer. The positive resist layer and/or the anti-reflective coatings may be removed using any suitable stripping process (e.g., wet or dry) known in the art. After the positive resist layer and/or the anti-reflective coatings have been removed, the wafer may be cleaned using any suitable cleaning process known in the art.

The method also includes transferring approximately an inverse of the patterned features formed in the first sacrificial layer to a second sacrificial layer (also referred to herein as "an additional sacrificial layer," "a second hard mask," and "a second, inverse pattern etch mask material") formed on the first sacrificial layer using a damascene type process. For example, in one embodiment, transferring approximately the inverse of the patterned features formed in the sacrificial layer to the device material includes transferring approximately the inverse of the patterned features formed in the sacrificial layer to the additional sacrificial layer and transferring approximately the patterned features formed in the additional sacrificial layer to the device material. In another embodiment, transferring approximately the inverse of the patterned features formed in the positive resist layer to a device material on the wafer includes forming a second sacrificial layer on the etched first sacrificial layer and removing the etched first sacrificial layer such that remaining portions of the second sacrificial layer form patterned features that are approximately the inverse of the patterned features formed in the first sacrificial layer.

Such an embodiment may also include removing the excess material of the second sacrificial layer before the etched first sacrificial layer is removed. For example, removing the excess material of the second sacrificial layer may include CMP. In another embodiment, removing the excess material of the second sacrificial layer includes an etch back process using reactive ion etching (RIE). In an additional embodiment, removing the excess material of the second sacrificial layer includes an etch back process using wet etching. In this manner, the embodiments described herein may use CMP, RIE (etch back), or wet etching (etch back) to form the inverse pattern in the second sacrificial material. In one such embodiment, the method includes transferring approximately an inverse of the patterned features to a second sacrificial layer by forming the second sacrificial layer on the first sacrificial layer, planarizing the second sacrificial layer, and removing the first sacrificial material. In this manner, the "tone" of the patterned features is inverted in the embodiments described herein by transferring a pattern etched into one sacrificial layer to another sacrificial layer formed thereon.

In one embodiment, the method includes forming an additional sacrificial layer on the wafer after the patterned features are formed in the sacrificial layer. In this manner, in one embodiment, transferring approximately the inverse of the patterned features in the sacrificial layer to a device material includes forming an additional sacrificial layer between the patterned features formed in the sacrificial material. As such, the method includes framing the second sacrificial layer within etched areas of the first sacrificial layer. For example, the method may include depositing an inlaid etch mask material (also referred to herein as the "second hard mask") on the etched first sacrificial material. This material may be deposited using any suitable process known in the art such as a spin-on process (spin on dielectric, spin on resist), CVD, PECVD, sputter deposition, molecular beam epitaxy, atomic layer deposition, electroplating, etc., or any combination thereof. Ideally, the inlaid material substantially completely fills the etched trenches in the first sacrificial layer. In other words, the second sacrificial layer preferably substantially fills the spaces formed by the etching of the first sacrificial layer.

Figure 7:
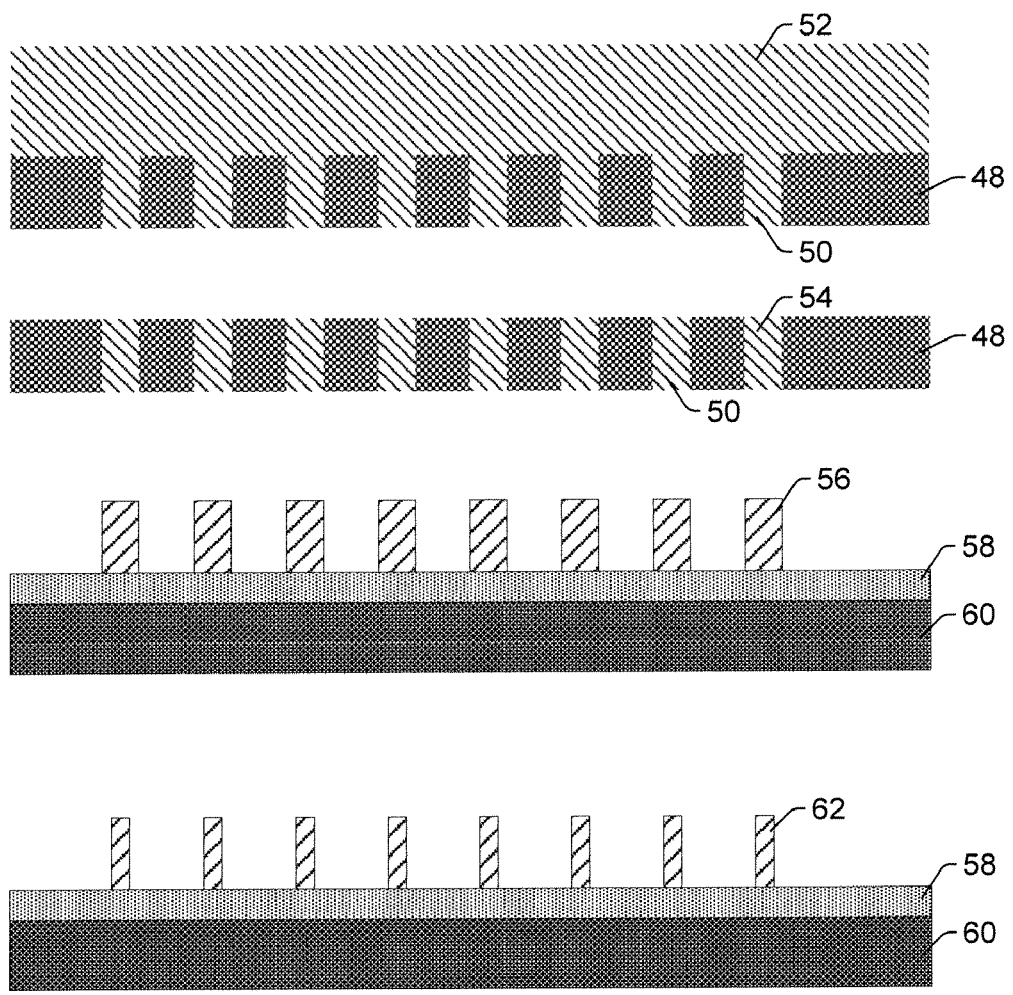

In one such example shown in FIG. 7, second sacrificial layer 52 is formed on patterned first sacrificial layer 48, which may be formed as described above with respect to FIG. 6. Second sacrificial layer 52 may be formed on the first sacrificial layer using a damascene type process. As shown in FIG. 7, second sacrificial layer 52 substantially completely fills trenches 50 formed in patterned first sacrificial layer 48. Second sacrificial layer 52 is also formed on upper surfaces of the patterned first sacrificial layer. Second sacrificial layer 52 may include any suitable material known in the art. For example, if patterned first sacrificial layer 48 is formed of a dielectric material, second sacrificial layer 52 may be formed of a dielectric material that has different etch characteristics (e.g., etch selectivity) than the patterned first sacrificial layer.

In addition, the method may include removing excess material of the second sacrificial layer that has been deposited outside the etched trenches in the first sacrificial layer. Removing the excess material may be performed with CMP, etch-back (e.g. reactive ion etching or wet etching), or reverse electroplating. The goal in this step is to substantially completely remove the second sacrificial layer from above the upper surfaces of the first sacrificial layer so that the first sacrificial layer can be removed in the next step.

In one such example shown in FIG. 7, second sacrificial layer 52 formed on the upper surfaces of patterned first sacrificial layer 48 may be removed leaving only remaining portions 54 of the second sacrificial layer in trenches 50 formed in the first sacrificial layer. Although an upper surface of remaining portions 54 is shown in FIG. 7 to be substantially planar with the upper surface of first sacrificial layer 48, it is acceptable if some of the second sacrificial layer in the etched trenches is removed (recessed) as long as enough of the second sacrificial layer remains in the trenches to provide adequate pattern transfer in subsequent etch steps.

In some embodiments, the method includes removing the first sacrificial layer. For example, in one embodiment, the method includes removing the first sacrificial layer such that remaining portions of the additional sacrificial layer form patterned features that are approximately the inverse of the patterned features formed in the first sacrificial layer. In such embodiments, the method may include selectively removing the first sacrificial layer using an appropriate etch process. In the example shown in FIG. 7, first sacrificial layer 48 has been removed without removing the remaining portions of the second sacrificial layer such that the remaining portions form patterned features 56 in the second sacrificial layer. The etch process used to remove the first sacrificial layer may include a selective etch process such as a wet etch process or a plasma etch process or some combination of wet etch and plasma etch processes. Examples of processes that may be used to remove the first sacrificial layer include processes used today when a sacrificial silicon nitride hard mask is removed after the hard mask has been used to transfer a pattern via etching into silicon (e.g., via shallow trench isolation (STI) etch), followed by silicon oxide deposition using CVD or PECVD to fill the STI trenches, removal of excess STI oxide with etch back or CMP, then selective removal of the silicon nitride.

In one embodiment, transferring approximately the inverse of the patterned features formed in the positive resist layer (and/or the first sacrificial layer) to a device material on the wafer includes etching the device material to transfer approximately the patterned features of the second sacrificial layer to the device material to form the device structures in the device material. For example, as shown in FIG. 7, patterned features 56 in the second sacrificial layer are approximately the inverse of the trenches that were formed in first sacrificial layer 48. Since the features formed in the first sacrificial layer were approximately the inverse of the device structures as described further above, patterned features 56 in the second sacrificial layer represent the device structures that are to be formed on the wafer and can be used to transfer the device structures to the device material.

As further shown in FIG. 7, patterned features 56 in the second sacrificial layer may be formed on optional third sacrificial layer 58. Third sacrificial layer 58 may include any appropriate masking material known in the art. In addition, optional third sacrificial layer 58 may be formed on device material 60 in any suitable manner. Device material 60 may include any appropriate device material(s) known in the art such as a gate material (e.g., polysilicon or metal gate material). Alternatively, patterned features 56 of the second sacrificial layer may be formed directly on device material 60.

The method may optionally include trimming the patterned features formed in the second sacrificial layer to achieve the desired feature widths, feature profiles, feature roughness, and/or to improve the robustness of pattern transfer in subsequent etch step(s). In particular, in one embodiment, the methods described herein include trim etching the pattern in the second sacrificial layer between selectively removing the first sacrificial layer and approximately transferring the pattern in the second sacrificial layer into the device material, which may be performed as described further herein. In this manner, the method may include trim etching of the second sacrificial material (damascene hard mask) prior to etching to transfer the pattern to the device layer(s). For example, as shown in FIG. 7, patterned features 56 of the second sacrificial layer may be trimmed (e.g., by an etch process) to form patterned features 62 having a width that is smaller than the width of patterned features 56. In this manner, the method may include a trim etch step to narrow the features formed in the second sacrificial layer.

In a further embodiment, the method may include depositing a material (not shown) on the patterned features formed in the second sacrificial layer to condition the sides of the patterned features formed in the second sacrificial layer to improve pattern transfer in subsequent etch step(s). Conditioning the sides of the patterned features as described above may be performed in any suitable manner using any suitable material(s). The method may also optionally include conditioning the side walls of patterned features formed in the second sacrificial layer to improve pattern transfer in subsequent etch step(s). Conditioning the side walls of the patterned features formed in the second sacrificial layer may include, for example, thermal treatment, chemical treatment, radiation curing, etc.

In another embodiment, the method optionally includes additional steps of etching and trimming of one or more or even many more hard mask materials as desired or beneficial. Such embodiments may be used when the appropriate materials are deposited on the wafer. For example, patterned structures 62 shown in FIG. 7 may be transferred to third sacrificial layer 58 if the third sacrificial layer is formed on the wafer. In one such example, an etch process may be used with patterned structures 62 as a mask to form patterned features 64 shown in FIG. 8 in the third sacrificial layer. The etch process used to transfer the patterned features to the third sacrificial layer may include any appropriate etch process known in the art.

Figure 8:
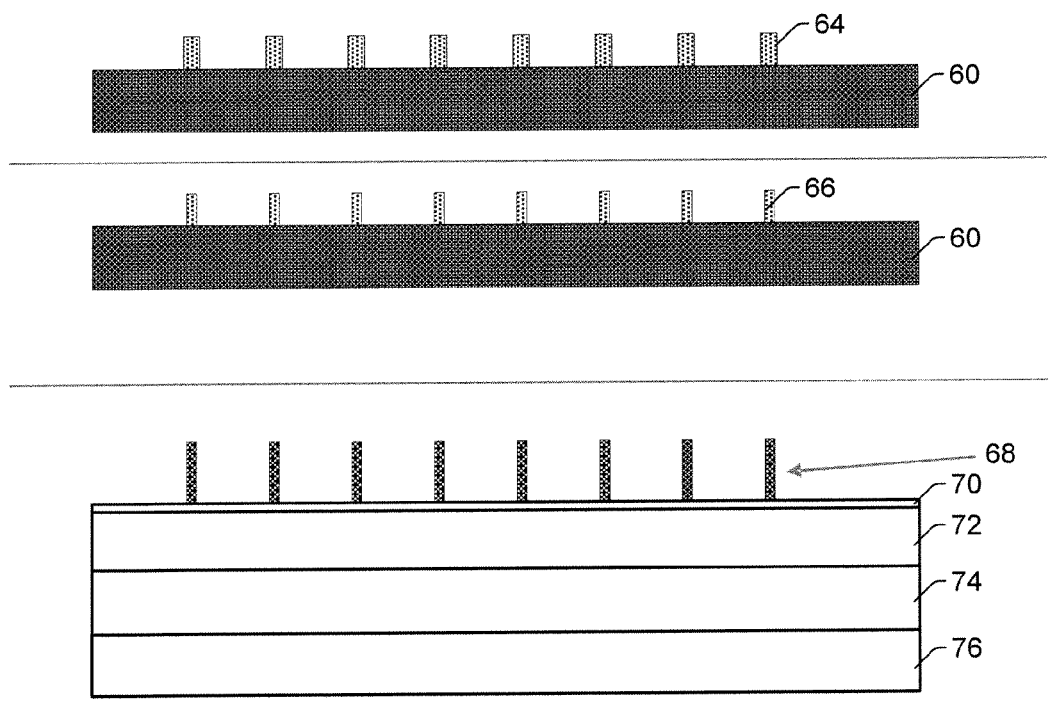

The method may optionally include trimming the patterned features formed in the third sacrificial layer to achieve the desired feature widths, feature profiles, feature roughness, and/or to improve the robustness of pattern transfer in subsequent etch step(s). For example, as shown in FIG. 8, patterned features 64 formed in the third sacrificial layer may be trimmed (e.g., by an etch process) to form patterned features 66 having a width that is smaller than the width of patterned features 64. In this manner, the method may include a trim etch step to narrow the features formed in the third sacrificial layer. In a further embodiment, the method includes depositing a material (not shown) on patterned features 66 to condition the sides of the patterned features formed in the third sacrificial layer to improve pattern transfer in subsequent etch step(s). Conditioning the sides of the patterned features as described above may be performed in any suitable manner using any suitable material(s). The method may also optionally include conditioning the side walls of the patterned features formed in the third sacrificial layer to improve pattern transfer in subsequent etch step(s). Conditioning the side walls of the patterned features formed in the third sacrificial layer may include, for example, thermal treatment, chemical treatment, radiation curing, etc.

The method further includes transferring approximately the patterned features formed in the third sacrificial layer to a device material using an etch process to form the device structures in the device material. In particular, the method includes etching a device material exposed by etching of one of the sacrificial layers (the second or third sacrificial layer) to form the device structures on the wafer. In this manner, the method includes transferring approximately the final sacrificial layer pattern via etching into the device material layer. The device material layer may be, for example, polysilicon used for forming transistor gates. In one embodiment, therefore, the device structures formed by the methods described herein include transistor gate structures. In another embodiment, the device structures formed by the methods described herein include memory word-line structures. In an additional embodiment, the device structures formed by the methods described herein include memory bit-line structures. The etching process may include any suitable etching process known in the art. In this manner, the inlaid material may be used as a hard mask in the methods described herein. In particular, the methods may include using the inlaid material as an etch mask for interleaved patterns exposed with two or more lithography exposures.

In the example shown in FIG. 8, an etch process may be performed on device material 60 using patterned features 66 as a mask. After the etch process, device structures 68 are formed in the device material. In this manner, the method may include a transfer etch to pattern a device material such as a gate material. In the case of a device material that is a gate material, device structures 68 may be formed on gate oxide layer 70, which may be a high-k dielectric material or any other suitable gate dielectric material known in the art. In addition, gate oxide layer 70 may be formed on active silicon layer 72, which may be a silicon-on-insulator (SOI) layer. Active silicon layer 72 may be formed on buried oxide layer 74, which may be formed on silicon wafer 76. Layers 70, 72, and 74 may be formed using any appropriate processes known in the art. Buried oxide layer 74 may be formed of any suitable dielectric material known in the art. In addition, silicon wafer 76 may include any suitable type of silicon wafer.

The embodiments described herein have a number of advantages over previously used methods for forming device structures on a wafer. For example, the embodiments described herein enable patterning using interleaved double exposure lithography. In addition, the embodiments described herein do not use or require negative resist. Using positive resists in the methods described herein is advantageous since positive resists perform better than negative resists today.

Another advantage of the embodiments described herein is that overlay error does not contribute to the width of final device structures (e.g. transistor gates). In particular, as described herein, the method may include forming the patterned features in the positive resist layer using two interleaved exposures of the positive resist layer. In one such embodiment, overlay error between the two interleaved exposures does not affect dimensions of the device structures in the device material. Therefore, the methods described herein can be advantageously used to form substantially small device structures on wafers. In addition, the methods described herein can be advantageously used to form substantially small device structures on the wafer using photolithography processes.

For example, in one embodiment, the method includes forming the patterned features in the positive resist layer using two interleaved photolithography exposures of the positive resist layer, which may be performed as described herein. In another embodiment, the method includes forming the patterned features in the sacrificial layer by forming approximately the patterned features in a positive resist layer formed on the sacrificial layer using two interleaved photolithography exposures of the positive resist layer and etching the sacrificial layer to transfer approximately the patterned features formed in the positive resist layer to the sacrificial layer. In some such embodiments, the device structures have a dimension in a direction substantially parallel to an upper surface of the wafer that is less than about 40 nm. In other words, the device structures may have a CD or a line width that is less than about 40 nm. In one particular example, the device structures may have a dimension in a direction substantially parallel to an upper surface of the wafer that is about 32 nm.

Furthermore, the estimated added cost to the industry for using the repeated sequence of lithography patterning, etching, and lithography patterning is estimated to be several billion dollars, possibly 100 billion dollars. Therefore, the methods described herein provide an alternative solution for such processing that can save the semiconductor industry billions of dollars. However, the embodiments described herein advantageously do not require two repeated sequences of lithography then etch for double exposure patterning.

In summary, therefore, one embodiment of a method for forming device structures on a wafer includes transferring approximately an inverse of patterned features formed in a positive resist layer on the wafer to a device material on the wafer to form the device structures in the device material. In one such embodiment, the transferring step includes exposing the positive resist layer using two different reticles for two interleaved exposures of the positive resist layer without performing a develop process on the wafer between the two interleaved exposures. Exposing the positive resist layer in this manner may be performed as described further herein. Each of the two different reticles includes only a portion of the patterned features. The two different reticles may be configured as described herein.

The transferring step also includes developing the exposed positive resist layer to form a resist pattern, which may be performed as described herein, and etching a first sacrificial layer to transfer the resist pattern into the first sacrificial layer with a first etch process thereby forming a pattern in the first sacrificial layer, which may also be performed as described herein. In addition, the transferring step includes cleaning remaining resist and etch residues from the etch process from the wafer and the etched first sacrificial layer in a first cleaning process, which may be performed as described herein.

The transferring step also includes depositing a second sacrificial layer after the cleaning step, which may be performed as described herein. In addition, the transferring step includes removing excess material of the second sacrificial layer to leave some of the second sacrificial layer in spaces of the pattern in the first sacrificial layer to form a pattern in the second sacrificial layer, which may be performed as described herein. For example, the removing step may include CMP, an etch back process using RIE, or an etch back process using wet etch. The transferring step further includes selectively removing the first sacrificial layer, which may be performed as described herein. In addition, the transferring step includes approximately transferring the pattern in the second sacrificial layer into the device material using process steps including a second etch process and a second cleaning process, which may be performed as described herein. In some embodiments, between selectively removing the first sacrificial layer and approximately transferring the pattern in the second sacrificial layer into the device material, the transferring step includes trim etching the pattern in the second sacrificial layer, which may be performed as described herein. The device structures formed in the embodiments described above may include any of the device structures described herein (e.g., transistor gate structures, memory word-line structures, and memory bit-line structures). The method embodiments described above may include any other step(s) of any other method(s) described herein.

As described above, therefore, the method may include two different interleaved exposures of a positive resist layer without performing a develop process between the two interleaved exposures. However, in another embodiment, the method may include performing a develop process between the two interleaved exposures, which are performed using two different resists. For example, another embodiment of a method for forming device structures on a wafer includes transferring approximately an inverse of patterned features in a positive resist layer on the wafer to a device material on the wafer to form the device structures in the device material.

In this embodiment, the transferring step includes exposing a first positive resist layer to only a first portion of the patterned features using a first reticle. This exposing step may be performed as described further herein. The transferring step also includes developing the first positive resist layer to form the first portion of the patterned features in the first positive resist layer. Developing the first positive resist layer may be performed as described herein.

The transferring step further includes depositing a second positive resist layer. The second positive resist layer may be deposited on the developed first positive resist layer in any suitable manner. The transferring step also includes exposing the second positive resist layer to only a second portion of the patterned features using a second reticle. Exposing the first positive resist layer and exposing the second positive resist layer include exposing two interleaved patterns. The two exposing steps may be performed as described further herein.

The transferring step also includes developing the second positive resist layer to form the second portion of the patterned features in the second positive resist layer. Developing the second positive resist layer may be performed as described herein. The transferring step further includes transferring the first and second portions of the patterned features into a first sacrificial layer with a first etch process to form a pattern in the first sacrificial layer, which may be performed as described further herein. In addition, the transferring step includes cleaning remaining first and second positive resist layers and etch residue from the first etch process from the wafer and the pattern in the first sacrificial layer, which may be performed as described herein.

The transferring step also includes depositing a second sacrificial layer after the cleaning step. The second sacrificial layer may be deposited as described further herein. In addition, the transferring step includes removing excess material of the second sacrificial layer to leave some of the second sacrificial layer in spaces of the pattern in the first sacrificial layer to form a pattern in the second sacrificial layer. The removing step may be performed as described further herein. For example, the removing step may include CMP, an etch back process using RIE, or an etch back process using wet etching.

The transferring step also includes selectively removing the first sacrificial layer, which may be performed as described herein. In addition, the transferring step includes approximately transferring the pattern in the second sacrificial layer into the device material using process steps including a second etch process and a second cleaning process, which may be performed as described further herein. In some embodiments, the transferring step includes between selectively removing the first sacrificial layer and approximately transferring the pattern in the second sacrificial layer into the device material, trim etching the pattern in the second sacrificial layer, which may be performed as described further herein. The device structures may include any of the device structures described herein (e.g., transistor gate structures, memory word-line structures, and memory bit-line structures). The embodiments of the method described above may include any other step(s) of any other method(s) described herein.

An alternative embodiment of a method for forming device structures on a wafer includes using a damascene type process (which may include etch, inlay (e.g., deposition using CVD, PECVD, a spin on material (like a resist or spin on dielectric), electro-plate deposition, sputter deposition, molecular beam epitaxy, atomic layer deposition, etc.), CMP or etch back to remove excess inlaid material, and selective removal of the etched layer on which the inlaid material was deposited to thereby pattern (construct) a second hard mask (etch masking structure) from the inlaid material to reverse the tone of a pattern etched into the first hard mask produced with two lithography patterning steps and two etch steps. For example, the method may include one or more etch steps between two or more lithography steps of the double patterning process.

In addition, a damascene etch mask process may be used for a combined pattern of two different reticles. In one such embodiment, the method includes fainting the patterned features in the positive resist layer using two interleaved exposures of the positive resist layer. Between the two interleaved exposures, the method includes developing the positive resist layer, etching a first sacrificial layer formed under the resist layer, and depositing a second sacrificial layer on the etched first sacrificial layer. In particular, the damascene type hard masks described herein may be used to reverse the tone of a double patterning process using a first lithography step, a first etch step, a second lithography step, and a second etch step to reduce, and possibly even remove, dependence on the line widths on overlay error. In other words, such an embodiment reduces and may even remove the impact of overlay error on CDs of device structures formed in double exposure processes. Such embodiments also do not require using a negative tone resist. The embodiments do require intermediate develop and/or etch steps between exposing the first patterned features and exposing the second patterned features. The embodiments described herein may be used if there is not adequate contrast in the same positive resist layer to allow double exposure lithography of interleaved patterns without an intermediate developing process.

In the embodiments described herein, the reticle for each feature is a reverse tone of the structure desired on the device. For example, if a line feature is desired on the wafer after completion of the multi-step patterning process, the reticle would have a linear space or other structures (e.g., structures that include OPC or other RET features) engineered to produce relatively bright light intensity (relatively high electromagnetic intensity) at that location (not a relatively dark region). The features on the second reticle are also primarily reverse tone of the device structures to be patterned with the second reticle. If a positive tone resist is exposed to radiation from the projected image of the first reticle or from the projected image of the second reticle, the resist will be removed when it is developed. If the first sacrificial layer is unprotected due to positive resist layer removal due to the exposure of the first reticle pattern or the second reticle pattern, the first sacrificial layer will be removed by the etch process following the exposure of the first reticle or the second reticle.

The method may include the following steps. In addition, it is to be understood that measurement and inspection steps appropriate or beneficial to each of these process steps may be included in the embodiments described herein, but will not be detailed herein for the sake or brevity. The measurement and inspection steps may include any appropriate measurement and inspection steps known in the art.

The method may include depositing the materials to be patterned on the wafer (substrate). For example, polysilicon may be deposited on the wafer for a transistor gate level, and one or more sacrificial layers (e.g., sacrificial layer(s) similar to those commonly referred to as "hard masks," which are generally used to improve pattern transfer of etch of resist patterns into device material layers) may be deposited on the wafer. The method may also include depositing an anti-reflection coating and positive photoresist on the wafer. The materials described above may be formed on the wafer as described herein or in any other suitable manner.

The method includes exposing a first positive resist layer formed on the wafer to produce a first patterned resist layer. For example, the method includes exposing a positive resist layer with the first pattern using a lithography system. The lithography system may include any of the lithography systems described herein. The method further includes developing the exposed first resist layer to produce the first patterned resist layer. Developing the exposed first resist layer may be performed as described herein.

Figure 9:
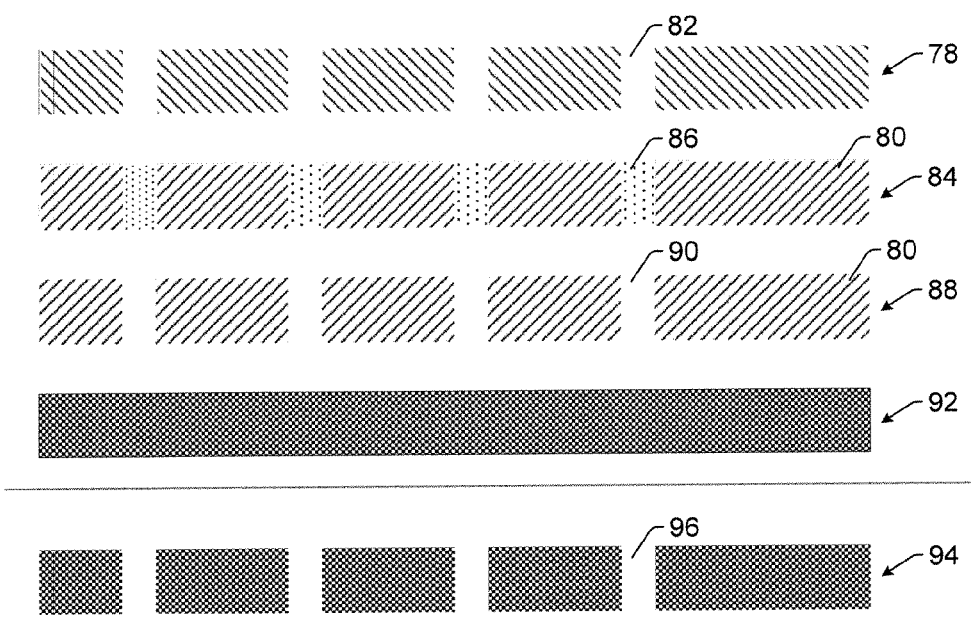
FIGS. 9-12 are schematic diagrams illustrating a cross-sectional view of a wafer after various steps of another embodiment of a method for forming device structures on the wafer.

Exposing a positive resist layer with a first pattern as described above using the reticle shown in FIG. 4 and a lithography system described above produces aerial image 78 shown in FIG. 9 that is projected onto a first positive resist layer. Aerial image 78 includes aerial images 82 of trenches 18 of the reticle shown in FIG. 4. Aerial images 82 are the relatively high radiation intensity portions of the aerial image that are projected onto the first positive resist layer. After exposure of the first positive resist layer to the aerial image, latent image 84 is formed in positive resist layer 80, as shown in FIG. 9. Latent image 84 includes latent images 86 of trenches 18 of the reticle shown in FIG. 4. Latent image 84 shown in FIG. 9 may be formed in the first positive resist layer after the exposure process and before the PEB process. Alternatively, latent image 84 may be formed in the first positive resist layer only after the PEB process. The latent image may include recessed portions (not shown) of the first positive resist layer that were exposed to aerial image 78.

The method also includes developing the first positive resist layer exposed to the first pattern. For example, developing first positive resist layer 80 shown in FIG. 9 after latent image 84 has been formed in the first positive resist layer produces first patterned resist 88 that includes trenches 90. Developing the exposed first positive resist layer may be performed using a resist processing system such as any of the resist processing systems described herein.

In some embodiments, the method optionally includes trim etching the first patterned resist if desired to achieve the desired feature widths, feature profiles, feature roughness, and/or to improve the robustness of pattern transfer in subsequent etch. This step may be performed as described further herein.

The method includes etching a first sacrificial layer exposed by the first patterned resist. For example, the method may include etching approximately the first pattern of the developed resist into the first sacrificial layer (also referred to herein as "the first hard mask material"), and the term "sacrificial layer" is intended to encompass all possible materials including, but not limited to, silicon nitride, silicon oxides, amorphous carbon materials, carbide-silicon materials, etc.

In one example shown in FIG. 9, first sacrificial layer 92 may be formed under first patterned resist 88. As shown in FIG. 9, after first patterned resist 88 has been formed, the first sacrificial layer is not patterned. However, after the first patterned resist has been formed, an etch process may be performed on the wafer. The etch process may be selected such that the areas of the first sacrificial layer that are exposed to the etch process by the first patterned resist are removed. In this manner, patterned first sacrificial layer 94 is formed by the etch process and includes trenches 96. As such, approximately the inverse of the device structures formed in the first patterned resist are transferred to the first sacrificial layer. The etch process used in this pattern transfer process may include any suitable etch process and may vary depending on the first sacrificial layer material.

In addition, the method includes removing the first patterned resist after transfer of the first pattern to the first sacrificial layer. The method may also include cleaning off the remaining first patterned resist, anti-reflection coatings, and etch by-products. These steps may be performed in any suitable manner.

The method also includes forming a second sacrificial layer within the etched areas of the first sacrificial layer. For example, the method may include depositing a second sacrificial layer to substantially fill the etched spaces and optionally planarizing the wafer (e.g., using CMP). In one example shown in FIG. 10, second sacrificial layer 98 may be formed in trenches 96 formed in first sacrificial layer 94. In this manner, second sacrificial layer 98 substantially fills spaces within the first sacrificial layer. Second sacrificial layer 98 may be a planarizing material such as a bottom anti-reflection coating, resist, or an optimized material such as a dielectric material having different planarization characteristics and different etch characteristics than the material of the first sacrificial layer.

The method further includes forming a second positive resist layer on the first sacrificial layer. The method may also include depositing an anti-reflection coating and a second positive resist layer on the wafer. The second positive resist layer and the anti-reflection coating may be formed on the wafer in any suitable manner and may include any suitable materials. The first and second positive resist layers may be formed of the same resist or different resists. In addition, the method includes exposing the second positive resist layer to produce a second patterned resist. In particular, the method includes exposing the second pattern using a lithography system. The lithography system may include any of the lithography systems described herein. The method further includes developing the exposed second positive resist layer. Developing the exposed second positive resist layer may be performed using any of the resist processing systems described herein.

Figure 10:
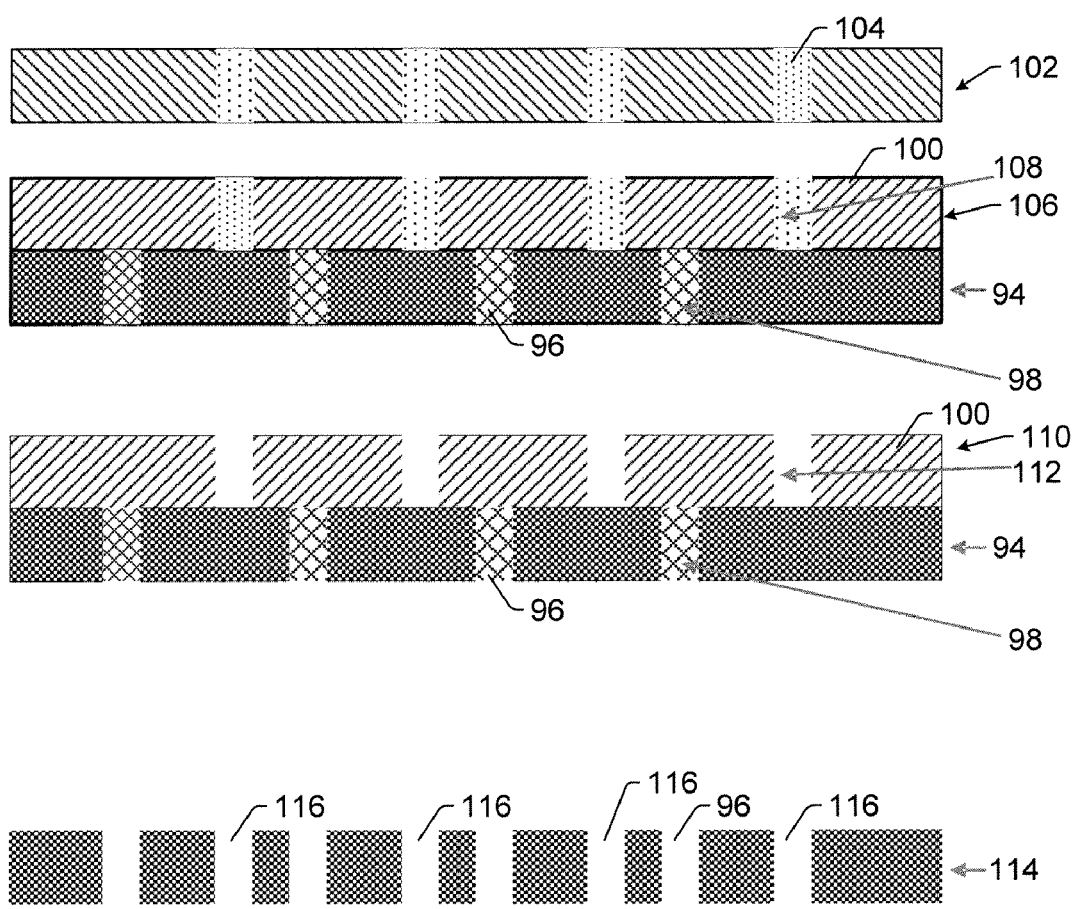

In one example, exposing the second positive resist layer with a second pattern as described above using the reticle shown in FIG. 5 and a lithography system described above produces aerial image 102 shown in FIG. 10 projected onto the second positive resist layer. Aerial image 102 includes aerial images 104 of trenches 16 of the reticle shown in FIG. 5. Aerial images 104 are the relatively high radiation intensity portions of the aerial image that are projected onto the second positive resist layer. After exposure of the second positive resist layer to aerial image 102, latent image 106 is formed in second positive resist layer 100, as shown in FIG. 10. Latent image 106 includes latent images 108 of trenches 16 of the reticle shown in FIG. 5. Latent image 106 shown in FIG. 10 may be formed in the second positive resist layer after the exposure process and before the PEB process. Alternatively, latent image 106 may be formed in the second positive resist layer only after the PEB process. Latent image 106 may include recessed portions (not shown) of the second positive resist layer that were exposed to aerial image 102.

Since a develop step and an etch step are performed after the first positive resist layer is patterned and before the second positive resist layer is exposed, there may be a larger overlay error between the features formed in the two exposure steps than in the methods described above in which develop and etch are not performed until after the two exposure steps. Ideally, however, the overlay error between the features formed in the two exposures steps is zero.

The method includes developing the second positive resist layer after exposure to the second pattern. For example, developing second positive resist layer 100 shown in FIG. 10 after latent image 106 has been formed in the second positive resist layer produces second patterned resist 110 that includes trenches 112. Developing the second positive resist layer may be performed using a resist processing system such as any of the resist processing systems described herein.

The method may optionally include trim etching the second patterned resist if desired to achieve the desired feature widths, feature profiles, feature roughness, and/or to improve the robustness of pattern transfer in subsequent etch step(s). The method may also optionally include thermal processing the second patterned resist to achieve the desired second pattern feature widths, feature profiles, feature roughness, and/or to improve the robustness of pattern transfer in subsequent etch step(s). These steps may be performed as described herein or in any other suitable manner.

The method also includes etching the first sacrificial layer exposed by the second patterned resist. In this manner, the method includes etching the pattern of the developed second pattern resist layer into the first sacrificial layer. The method further includes removing the second patterned resist and the second sacrificial material within the etched areas of the first sacrificial layer. In addition, the method may include removing the resist and/or all anti-reflective coatings and the planarization material deposited after etch of the first sacrificial layer. Removing these materials may be performed using any suitable process or processes known in the art. In addition, the method may include cleaning the wafer. The wafer may be cleaned using any suitable process or processes known in the art.

In one such example shown in FIG. 10, patterned first sacrificial layer 94 is formed under second patterned resist 110. As shown in FIG. 10, after second patterned resist 110 has been formed, the first sacrificial layer is patterned with the first pattern. In addition, after second patterned resist 110 has been formed, an etch process may be performed on the wafer. The etch process may be selected such that the areas of the first sacrificial layer that are exposed to the etch process by second patterned resist 110 are removed. In this manner, patterned first sacrificial layer 114 includes trenches 116 after the etch process. As such, approximately the inverse of the device structures formed in the second patterned resist are transferred to the first sacrificial layer. After formation of trenches 116, second patterned resist 110 and material 96 may be removed from the patterned first sacrificial layer using any appropriate process (e.g., an etch process) known in the art. Therefore, trenches 96 and 116 are formed in patterned first sacrificial layer 114. As shown in FIG. 10, overlay error may affect the widths of alternating features formed in the patterned first sacrificial layer.

The method also includes forming a third sacrificial layer within etched areas of the first sacrificial layer. For example, the method may include depositing an inlaid etch mask material (also referred to herein as "the third hard mask material") on the wafer. This material may be deposited with a spin on process (using a spin on dielectric, a spin on resist, etc.), CVD, PECVD, sputter deposition, molecular beam epitaxy, electroplating, atomic layer deposition, etc., or any combination thereof. Ideally, the inlaid material substantially completely fills the etched trenches in the first sacrificial layer.

Figure 11:
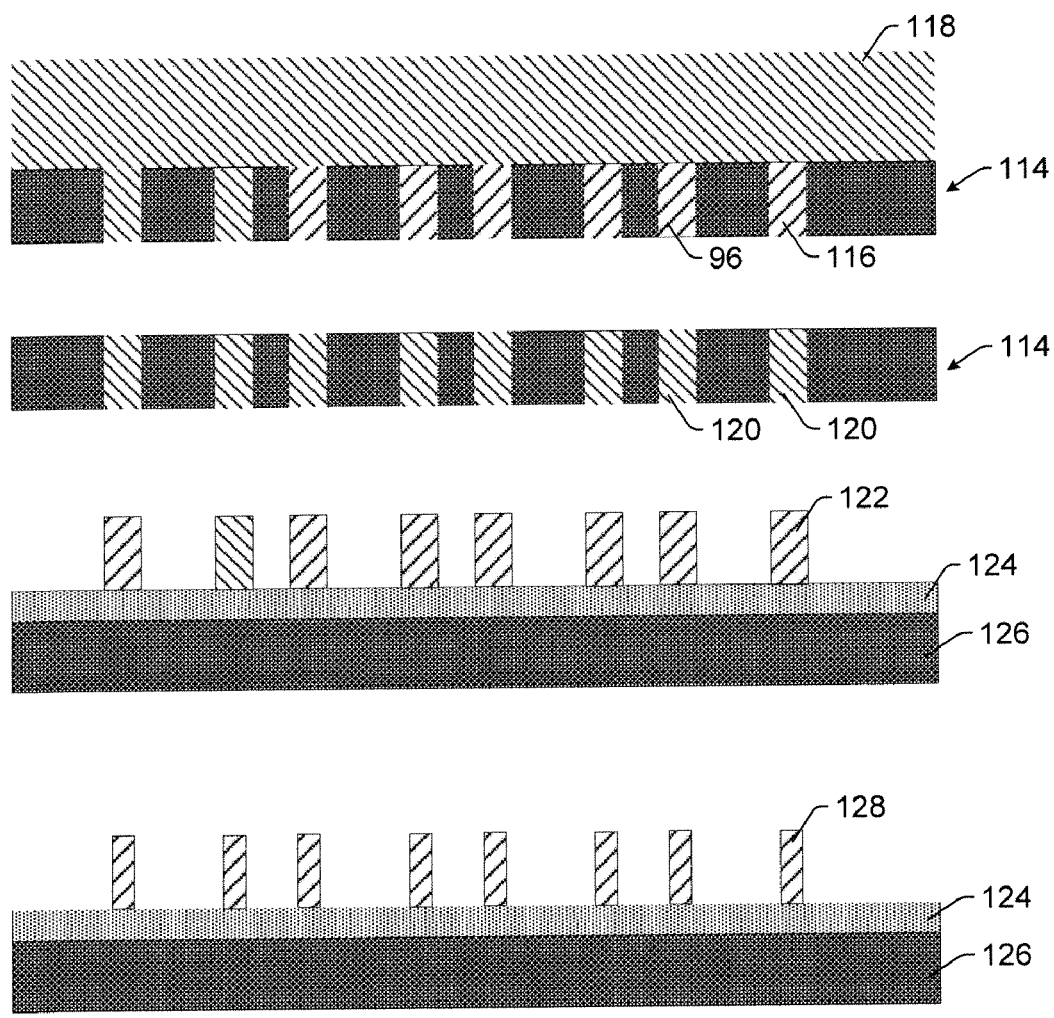

In one such example shown in FIG. 11, third sacrificial layer 118 is formed on patterned first sacrificial layer 114, which may be formed as described above with respect to FIG. 10. Third sacrificial layer 118 may be formed on the patterned first sacrificial layer using a damascene type process. As shown in FIG. 11, third sacrificial layer 118 substantially completely fills trenches 96 and 116 formed in patterned first sacrificial layer 114. In addition, third sacrificial layer 118 is formed on upper surfaces of the patterned first sacrificial layer. Third sacrificial layer 118 may include any suitable material known in the art. For example, if patterned first sacrificial layer 114 is formed of a dielectric material, third sacrificial layer 118 may be formed of a dielectric material that has different etch characteristics than the patterned first sacrificial layer.

The method may also include removing excess material of the third sacrificial layer that has been deposited outside the etched trenches in the first sacrificial layer. Removing the excess material may be performed using CMP, etch-back (e.g. reactive ion etching or wet etching), or reverse electroplating. The goal of this step is to substantially completely remove the third sacrificial layer from above the first sacrificial layer so that the first sacrificial layer can be removed in the next step.

In one such example shown in FIG. 11, third sacrificial layer 118 formed on the upper surfaces of patterned first sacrificial layer 114 may be removed leaving only remaining material 120 of the third sacrificial layer in trenches of the first sacrificial layer. Although an upper surface of remaining material 120 is shown in FIG. 11 to be substantially planar with the upper surface of first sacrificial layer 114, it is acceptable if some of the third sacrificial layer in the etched trenches is removed (recessed) as long as enough of the third sacrificial layer remains to provide adequate pattern transfer in subsequent etch step(s).

In addition, the method includes removing the first sacrificial layer. For example, the method may include selectively removing the first sacrificial layer using an appropriate etch process such as a wet etch process or a plasma etch process. In the example shown in FIG. 11, first sacrificial layer 114 has been removed without removing remaining material 120 of the third sacrificial layer such that remaining material 120 forms patterned features 122. Examples of an appropriate process for this step include processes that are performed today when a sacrificial silicon nitride hard mask is removed after it is used to transfer a pattern via etching into silicon (STI etch), followed by silicon oxide deposition using CVD or PECVD to fill the STI trenches, removal of excess STI oxide with etch back or CMP, then selective removal of the silicon nitride.

As shown in FIG. 11, patterned features 122 are approximately the inverse of the trenches that were formed in first sacrificial layer 114. Since the features formed in the first sacrificial layer were approximately the inverse of the device structures as described further above, patterned features 122 represent the device structures that are to be formed on the wafer and can be used to transfer the device structures to the device material. As further shown in FIG. 11, patterned features 122 may be formed on optional fourth sacrificial layer 124. Fourth sacrificial layer 124 may include any appropriate masking material known in the art. In addition, optional fourth sacrificial layer 124 may be formed on device material 126 in any suitable manner. Device material 126 may include any appropriate device material known in the art such as a gate material (e.g., polysilicon or metal gate material) and may be formed on the wafer in any suitable manner. Alternatively, patterned features 122 may be formed directly on device material 126.

The method may optionally include trim etching the patterned features formed in the third sacrificial layer to achieve the desired feature widths, feature profiles, feature roughness, or to improve the robustness of pattern transfer in subsequent etch step(s). For example, as shown in FIG. 11, patterned features 122 may be trimmed (e.g., by an etch process) to form patterned features 128 having a width that is smaller than the width of patterned features 122. In this manner, the method may include a trim etch step to narrow the features formed in the third sacrificial layer. The trim etch step may include any appropriate etch process known in the art.

The method may also optionally include depositing a material (not shown) to condition the sides of the patterned features formed in the third sacrificial layer to improve pattern transfer in subsequent etch step(s). Conditioning the sides of the patterned features may be performed in any suitable manner known in the art. The method may further optionally include conditioning the side walls of the patterned features formed in the third sacrificial layer to improve pattern transfer in subsequent etch step(s). Conditioning the side walls of the patterned features formed in the third sacrificial layer may include thermal treatment, chemical treatment, radiation curing, etc.

The method may also optionally include additional steps of etching and trimming for one or more or even many more hard mask materials as desired or beneficial. The materials that may be etched and trimmed in these steps include materials deposited on the wafer prior to beginning the patterning process. For example, patterned structures 128 shown in FIG. 11 may be transferred to fourth sacrificial layer 124 if the fourth sacrificial layer is formed on the wafer. For example, an etch process may be used with patterned structures 128 as a mask to form patterned features 130 shown in FIG. 12 in the fourth sacrificial layer. The etch process used to transfer the patterned features to the fourth sacrificial layer may include any appropriate etch process known in the art.

Figure 12:
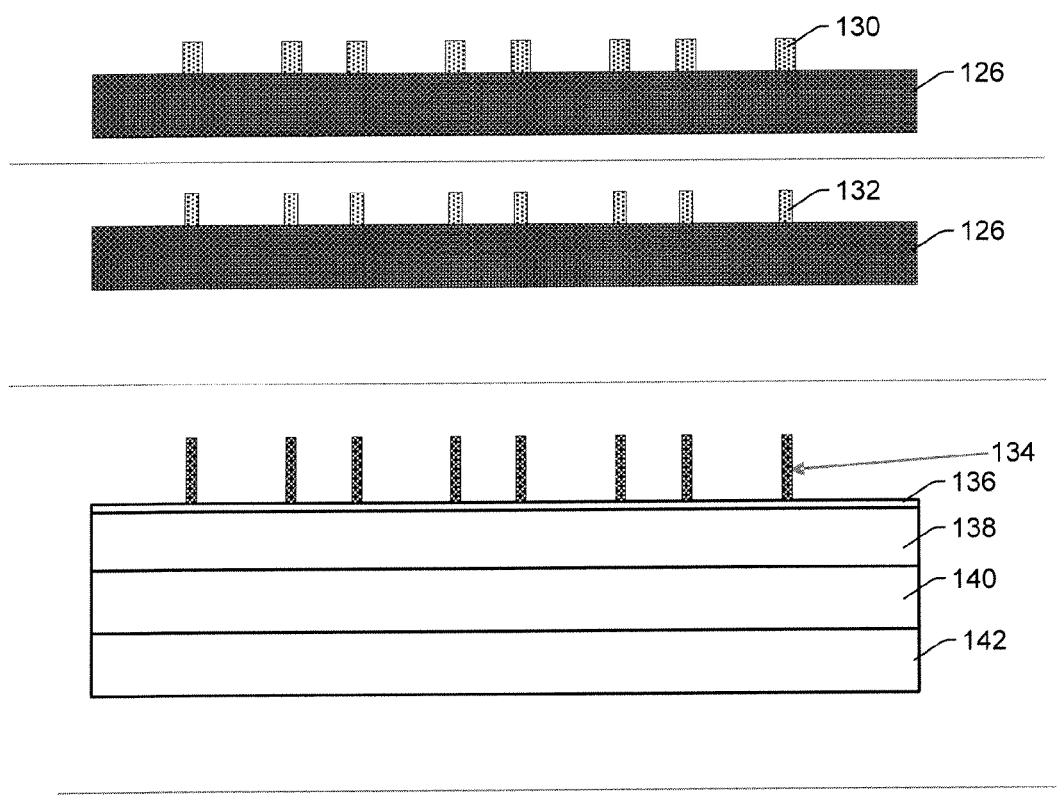

The method may optionally include trimming the patterned features formed in the fourth sacrificial layer to achieve the desired feature widths, feature profiles, feature roughness, and/or to improve the robustness of pattern transfer in subsequent etch step(s). For example, as shown in FIG. 12, patterned features 130 formed in the fourth sacrificial layer may be trimmed (e.g., by an etch process) to form patterned features 132 having a width that is smaller than the width of patterned features 130. In this manner, the method may include a trim etch step to narrow the features formed in the fourth sacrificial layer. The trim etch step may include any suitable etch process known in the art.

In a further embodiment, the method may include depositing a material (not shown) on patterned features 132 to condition the sides of the patterned features formed in the fourth sacrificial layer to improve pattern transfer in subsequent etch step(s). Conditioning the sides of the patterned features in this manner may be performed in any suitable manner. The method may also optionally include conditioning the side walls of the patterned features formed in the fourth sacrificial layer to improve pattern transfer in subsequent etch step(s). Conditioning the side walls of the patterned features formed in the fourth sacrificial layer may include, for example, thermal treatment, chemical treatment, radiation curing, etc.

The method further includes etching a device material exposed by one of the patterned additional sacrificial layers (the third or fourth sacrificial layer) to form the device structures on the wafer. Therefore, the method includes transferring the final sacrificial layer pattern via etching into the device material layer to form the device structures on the wafer. In one example, the device material may include polysilicon for transistor gates. The etch process used in this step may include any suitable etch process known in the art.

In the example shown in FIG. 12, an etch process may be performed on device material 126 using patterned features 132 as a mask. After the etch process, device structures 134 are formed in the device material. In this manner, the method may include a transfer etch to pattern a device material such as a gate material. In the case of a device material that is a gate material, device structures 134 may be formed on gate oxide layer 136, which may be a high-k dielectric material or any other suitable gate dielectric material known in the art. In addition, gate oxide layer 136 may be formed on active silicon layer 138, which may be a SOI layer. Active silicon layer 138 may be formed on buried oxide layer 140, which may be formed on silicon wafer 142. Layers 136, 138, and 140 may be formed using any appropriate processes known in the art. Buried oxide layer 140 may be formed of any suitable dielectric material known in the art. In addition, silicon wafer 142 may include any suitable type of silicon wafer.

As described above, therefore, the method may include exposing two different positive resist layers, and between the exposures, the method may include developing the first positive resist layer, etching the first sacrificial layer, and depositing a second sacrificial layer. In this manner, the second positive resist layer may be deposited onto a relatively flat surface. In other embodiments, however, the method may not include depositing the second sacrificial layer between the two different exposures.

In general, therefore, some embodiments of a method for forming device structures on a wafer include transferring approximately an inverse of patterned features formed in a positive resist layer on the wafer to a device material on the wafer to form the device structures in the device material. The transferring step includes exposing a first pattern in a first positive resist layer using a first of two different reticles designed to form two interleaved patterns. Each of the two different reticles includes only a portion of the patterned features. Exposing the first pattern may be performed as described further herein. In addition, each of the two different reticles may be configured as described further herein.

The transferring step also includes developing the exposed first positive resist layer to form a first resist pattern, which may be performed as described herein. In addition, the transferring step includes transferring the first resist pattern into a first sacrificial layer with a first etch process to form a first pattern in the first sacrificial layer, which may be performed as described herein.

The transferring step includes depositing a second positive resist layer, which may be performed as described herein. In addition, the transferring step includes aligning a second of the two different reticles to the first pattern in the first sacrificial layer, to another pattern formed on the wafer, or another material on the wafer, which may be performed in any suitable manner known in the art. The transferring step further includes exposing a second pattern in the second positive resist layer using the second of the two different reticles, which may be performed as described herein. Furthermore, the transferring step includes developing the exposed second positive resist layer to form a second resist pattern, which may be performed as described herein.

The transferring step also includes transferring the second resist pattern into the first sacrificial layer with a second etch process to form a second pattern in the first sacrificial layer, which may be performed as described herein, and cleaning remaining resist and etch residues from the wafer and the first and second patterns in the first sacrificial layer, which may be performed as described herein. In addition, the transferring step includes depositing a second sacrificial layer after the cleaning step, which may be performed as described herein.

The transferring step further includes removing excess material of the second sacrificial layer to leave some of the second sacrificial layer in spaces of the first and second patterns in the first sacrificial layer to form a pattern in the second sacrificial layer, which may be performed as described herein. For example, the removing step may include CMP, an etch back process using RIE, or an etch back process using wet etching. In addition, the transferring step includes selectively removing the first sacrificial layer, which may be performed as described herein. The transferring step also includes approximately transferring the pattern in the second sacrificial layer into the device material using process steps including a third etch process and a second cleaning process, which may be performed as described herein. In some embodiments, between selectively removing the first sacrificial layer and approximately transferring the pattern in the second sacrificial layer into the device material, the transferring step includes trim etching the pattern in the second sacrificial layer. In the embodiments described above, the device structures may include any of the device structures described herein (e.g., transistor gate structures, memory word-line structures, and memory bit-line structures). The embodiments of the method described above may include any other step(s) of any other method(s) described herein.

As described above, the patterned positive resist layer or layers may be used as a mask for etching approximately the pattern into a first sacrificial layer. However, in other embodiments, the patterned resist layer(s), which may be formed accordingly to any of the embodiments described herein, may serve as the first sacrificial layer, and the second sacrificial layer is deposited directly on patterned resist structures. The second sacrificial layer may then be removed from above the patterned resist structures (e.g., by CMP and/or RIE etch back and/or wet etching etch back), then the resist is removed, leaving approximately the inverse pattern in the remaining material of the second sacrificial material. Finally etching approximately transfers the inverse pattern into the device material(s). Each of the steps described above may be further performed as described herein.

In one such embodiment, the method includes forming the patterned features in the positive resist layer, which may be performed as described herein. In such an embodiment, the transferring step includes depositing a sacrificial layer on the patterned features in the positive resist layer, which may be performed as described herein. In addition, the transferring step includes removing the sacrificial layer formed above the patterned features in the positive resist layer, which may be performed as described herein. The transferring step further includes removing the positive resist layer such that remaining portions of the sacrificial layer form patterned features that are approximately the inverse of the patterned features formed in the positive resist layer. Removing the positive resist layer may be performed in any suitable manner. The transferring step also includes transferring approximately the patterned features formed in the sacrificial material to the device material, which may be performed as described further herein (e.g., by an etch process). The embodiments of the method described above may include any other step(s) described herein.

Additional embodiments relate to a semiconductor device formed by any of the method embodiments described herein. The semiconductor device includes any device that can be formed as described herein.

Further modifications and alternative embodiments of various aspects of the invention may be apparent to those skilled in the art in view of this description. For example, methods for forming device structures on a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming device structures on a wafer, comprising transferring approximately an inverse of patterned features formed in a positive resist layer on the wafer to a device material on the wafer to form the device structures in the device material, wherein the device material is formed on the wafer prior to formation of the patterned features in the positive resist layer, wherein the patterned features and the inverse of the patterned features have the same two-dimensional shapes defined in a plane parallel to an upper surface of the wafer, and wherein the patterned features and the inverse of the patterned features have substantially the same two-dimensional positions on the wafer defined in the plane parallel to the upper surface of the wafer.

2. The method of claim 1, further comprising forming the patterned features in the positive resist layer using two different reticles for two interleaved exposures of the positive resist layer, wherein each of the two different reticles comprises only a portion of the patterned features.

3. The method of claim 1, further comprising forming the patterned features in the positive resist layer by exposing two different patterns on one reticle sequentially in two interleaved exposures of the positive resist layer.

4. The method of claim 1, further comprising forming the patterned features in the positive resist layer using two interleaved exposures of the positive resist layer without performing a develop process on the wafer between the two interleaved exposures.

5. The method of claim 1, further comprising forming the patterned features in the positive resist layer using two interleaved exposures of the positive resist layer without performing an etch process on the wafer between the two interleaved exposures.

6. The method of claim 1, further comprising forming the patterned features in the positive resist layer using two interleaved exposures of the positive resist layer, wherein exposure doses used for the two interleaved exposures are different and selected based on differences in time between each of the two interleaved exposures and a develop process.

7. The method of claim 1, further comprising forming the patterned features in the positive resist layer using two interleaved exposures of the positive resist layer, wherein focus settings used for the two interleaved exposures are different and selected based on differences in time between each of the two interleaved exposures and a develop process.

8. The method of claim 1, further comprising forming the patterned features in the positive resist layer using two different reticles for two interleaved exposures of the positive resist layer, wherein one or more characteristics of features formed on the two different reticles are selected based on differences in time between each of the two interleaved exposures and a develop process.

9. The method of claim 1, further comprising forming the patterned features in the positive resist layer using two different reticles for two interleaved exposures of the positive resist layer, wherein the two different reticles comprise metrology targets configured for measurements of one or more characteristics of the patterned features resulting from a first of the two interleaved exposures, one or more characteristics of the patterned features resulting from a second of the two interleaved exposures, and one or more characteristics of the patterned features resulting from a combination of the two interleaved exposures.

10. The method of claim 1, further comprising forming the patterned features in the positive resist layer using two interleaved exposures of the positive resist layer and between the two interleaved exposures, developing the positive resist layer, etching a first sacrificial layer formed under the resist layer, and depositing a second sacrificial layer on the etched first sacrificial layer.

11. The method of claim 1, wherein said transferring comprises etching a first sacrificial layer to transfer approximately the patterned features formed in the positive resist layer to the first sacrificial layer, forming a second sacrificial layer on the etched first sacrificial layer, removing the etched first sacrificial layer such that remaining portions of the second sacrificial layer form patterned features that are approximately the inverse of the patterned features formed in the first sacrificial layer, and etching the device material to transfer approximately the patterned features of the second sacrificial layer to the device material to form the device structures in the device material.

12. The method of claim 1, further comprising forming the patterned features in the positive resist layer using two interleaved exposures of the positive resist layer, wherein overlay error between the two interleaved exposures does not affect dimensions of the device structures in the device material.

13. The method of claim 1, further comprising forming the patterned features in the positive resist layer using two interleaved photolithography exposures of the positive resist layer, wherein the device structures have a dimension in a direction substantially parallel to the upper surface of the wafer that is less than about 40 nm.

14. The method of claim 1, further comprising forming the patterned features in the positive resist layer, wherein said transferring comprises depositing a sacrificial layer on the patterned features in the positive resist layer, removing the sacrificial layer formed above the patterned features in the positive resist layer, removing the positive resist layer such that remaining portions of the sacrificial layer form patterned features that are approximately the inverse of the patterned features formed in the positive resist layer, and transferring approximately the patterned features formed in the sacrificial material to the device material.

15. The method of claim 1, wherein the device structures comprise transistor gate structures.

16. A method for forming device structures on a wafer, comprising:
   forming a device material on the wafer before a sacrificial layer is formed on the wafer such that the device material is formed on the wafer prior to formation of patterned features in the sacrificial layer; and
   transferring approximately an inverse of the patterned features formed in the sacrificial layer on the wafer to the device material on the wafer to form the device structures in the device material, wherein the patterned features and the inverse of the patterned features have the same two-dimensional shapes defined in a plane parallel to an upper surface of the wafer, and wherein the patterned features and the inverse of the patterned features have substantially the same two-dimensional positions on the wafer defined in the plane parallel to the upper surface of the wafer.

17. The method of claim 16, further comprising forming an additional sacrificial layer on the wafer after the patterned features are formed in the sacrificial layer, wherein said transferring comprises transferring approximately the inverse of the patterned features formed in the sacrificial layer to the additional sacrificial material and transferring approximately the patterned features formed in the additional sacrificial material to the device material.

18. The method of claim 16, wherein said transferring comprises forming an additional sacrificial layer between the patterned features formed in the sacrificial layer, removing the sacrificial layer such that remaining portions of the additional sacrificial layer form patterned features that are approximately the inverse of the patterned features formed in the sacrificial layer, and etching the device material to transfer approximately the patterned features of the additional sacrificial layer to the device material to form the device structures in the device material.

19. The method of claim 16, further comprising forming the patterned features in the sacrificial layer by forming approximately the patterned features in a positive resist layer formed on the sacrificial layer using two interleaved exposures of the positive resist layer and etching the sacrificial layer to transfer approximately the patterned features formed in the positive resist layer to the sacrificial layer.

20. The method of claim 16, further comprising forming the patterned features in the sacrificial layer by forming approximately the patterned features in a positive resist layer formed on the sacrificial layer using two interleaved photolithography exposures of the positive resist layer and etching the sacrificial layer to transfer approximately the patterned features formed in the positive resist layer to the sacrificial layer, wherein the device structures have a dimension in a direction substantially parallel to the upper surface of the wafer that is less than about 40 nm.

21. The method of claim 16, wherein the device structures comprise transistor gate structures.

22. A method for forming device structures on a wafer, comprising transferring approximately an inverse of patterned features formed in a positive resist layer on the wafer to a device material on the wafer to form the device structures in the device material, wherein the device material is formed on the wafer prior to formation of the patterned features in the positive resist layer, wherein the patterned features and the inverse of the patterned features have the same two-dimensional shapes defined in a plane parallel to an upper surface of the wafer, wherein the patterned features and the inverse of the patterned features have substantially the same two-dimensional positions on the wafer defined in the plane parallel to the upper surface of the wafer, and wherein said transferring comprises:
   transferring the patterned features formed in the positive resist layer on the wafer to a first sacrificial material formed under the positive resist layer to form approximately the patterned features in the first sacrificial material;
   transferring approximately an inverse of the patterned features in the first sacrificial material to a second sacrificial material deposited on the first sacrificial material to form approximately the inverse of the patterned features in the second sacrificial material; and
   transferring approximately the patterned features of the second sacrificial material to the device material formed under the second sacrificial material to form the device structures in the device material.

23. A method for forming device structures on a wafer, comprising transferring approximately an inverse of patterned features formed in a positive resist layer on the wafer to a device material on the wafer to form the device structures in the device material, wherein the device material is formed on the wafer prior to formation of the patterned features in the positive resist layer, wherein the patterned features and the inverse of the patterned features have the same two-dimensional shapes defined in a plane parallel to an upper surface of the wafer, wherein the patterned features and the inverse of the patterned features have substantially the same two-dimensional positions on the wafer defined in the plane parallel to the upper surface of the wafer, and wherein said transferring comprises:
   exposing the positive resist layer using two different reticles for two interleaved exposures of the positive resist layer without performing a develop process on the wafer between the two interleaved exposures, wherein each of the two different reticles comprises only a portion of the patterned features;
   developing the exposed positive resist layer to form a resist pattern;
   etching a first sacrificial layer to transfer the resist pattern into the first sacrificial layer with a first etch process thereby forming a pattern in the first sacrificial layer;
   cleaning remaining resist and etch residues from the etch process from the wafer and the etched first sacrificial layer in a first cleaning process;
   depositing a second sacrificial layer after said cleaning;
   removing excess material of the second sacrificial layer to leave some of the second sacrificial layer in spaces of the pattern in the first sacrificial layer to form a pattern in the second sacrificial layer;
   selectively removing the first sacrificial layer; and
   approximately transferring the pattern in the second sacrificial layer into the device material using process steps comprising a second etch process and a second cleaning process.

24. The method of claim 23, wherein the device structures comprise transistor gate structures.

25. The method of claim 23, wherein the device structures comprise memory word-line structures.

26. The method of claim 23, wherein the device structures comprise memory bit-line structures.

27. The method of claim 23, wherein said removing comprises chemical mechanical planarization.

28. The method of claim 23, wherein said removing comprises an etch back process using reactive ion etching.

29. The method of claim 23, wherein said removing comprises an etch back process using wet etching.

30. The method of claim 23, further comprising between said selectively removing and said approximately transferring, trim etching the pattern in the second sacrificial layer.

31. A method for forming device structures on a wafer, comprising transferring approximately an inverse of patterned features formed in a positive resist layer on the wafer to a device material on the wafer to form the device structures in the device material, wherein the device material is formed on the wafer prior to formation of the patterned features in the positive resist layer, wherein the patterned features and the inverse of the patterned features have the same two-dimensional shapes defined in a plane parallel to an upper surface of the wafer, wherein the patterned features and the inverse of the patterned features have substantially the same two-dimensional positions on the wafer defined in the plane parallel to the upper surface of the wafer, and wherein said transferring comprises:
- exposing a first positive resist layer to only a first portion of the patterned features using a first reticle;
- developing the first positive resist layer to form the first portion of the patterned features in the first positive resist layer;
- depositing a second positive resist layer;
- exposing the second positive resist layer to only a second portion of the patterned features using a second reticle, wherein exposing the first positive resist layer and exposing the second positive resist layer comprise exposing two interleaved patterns;
- developing the second positive resist layer to form the second portion of the patterned features in the second positive resist layer;
- transferring the first and second portions of the patterned features into a first sacrificial layer with a first etch process to form a pattern in the first sacrificial layer;
- cleaning remaining first and second positive resist layers and etch residue from the first etch process from the wafer and the pattern in the first sacrificial layer;
- depositing a second sacrificial layer after said cleaning;
- removing excess material of the second sacrificial layer to leave some of the second sacrificial layer in spaces of the pattern in the first sacrificial layer to form a pattern in the second sacrificial layer;
- selectively removing the first sacrificial layer; and
- approximately transferring the pattern in the second sacrificial layer into the device material using process steps comprising a second etch process and a second cleaning process.

32. The method of claim 31, wherein the device structures comprise transistor gate structures.

33. The method of claim 31, wherein the device structures comprise memory word-line structures.

34. The method of claim 31, wherein the device structures comprise memory bit-line structures.

35. The method of claim 31, wherein said removing comprises chemical mechanical planarization.

36. The method of claim 31, wherein said removing comprises an etch back process using reactive ion etching.

37. The method of claim 31, wherein said removing comprises an etch back process using wet etching.

38. The method of claim 31, further comprising between said selectively removing and said approximately transferring, trim etching the pattern in the second sacrificial layer.

39. A method for forming device structures on a wafer, comprising transferring approximately an inverse of patterned features formed in a positive resist layer on the wafer to a device material on the wafer to form the device structures in the device material, wherein the device material is formed on the wafer prior to formation of the patterned features in the positive resist layer, wherein the patterned features and the inverse of the patterned features have the same two-dimensional shapes defined in a plane parallel to an upper surface of the wafer, wherein the patterned features and the inverse of the patterned features have substantially the same two-dimensional positions on the wafer defined in the plane parallel to the upper surface of the wafer, and wherein said transferring comprises:
- exposing a first pattern in a first positive resist layer using a first of two different reticles designed to form two interleaved patterns, wherein each of the two different reticles comprises only a portion of the patterned features;
- developing the exposed first positive resist layer to form a first resist pattern;
- transferring the first resist pattern into a first sacrificial layer with a first etch process to form a first pattern in the first sacrificial layer;
- depositing a second positive resist layer;
- aligning a second of the two different reticles to the first pattern in the first sacrificial layer, to another pattern formed on the wafer, or another material on the wafer;
- exposing a second pattern in the second positive resist layer using the second of the two different reticles;
- developing the exposed second positive resist layer to form a second resist pattern;
- transferring the second resist pattern into the first sacrificial layer with a second etch process to form a second pattern in the first sacrificial layer;
- cleaning remaining resist and etch residues from the wafer and the first and second patterns in the first sacrificial layer;
- depositing a second sacrificial layer after said cleaning;
- removing excess material of the second sacrificial layer to leave some of the second sacrificial layer in spaces of the first and second patterns in the first sacrificial layer to form a pattern in the second sacrificial layer;
- selectively removing the first sacrificial layer; and
- approximately transferring the pattern in the second sacrificial layer into the device material using process steps comprising a third etch process and a second cleaning process.

40. The method of claim 39, wherein the device structures comprise transistor gate structures.

41. The method of claim 39, wherein the device structures comprise memory word-line structures.

42. The method of claim 39, wherein the device structures comprise memory bit-line structures.

43. The method of claim 39, wherein said removing comprises chemical mechanical planarization.

44. The method of claim 39, wherein said removing comprises an etch back process using reactive ion etching.

45. The method of claim 39, wherein said removing comprises an etch back process using wet etching.

46. The method of claim 39, further comprising between said selectively removing and said approximately transferring, trim etching the pattern in the second sacrificial layer.

* * * * *